United States Patent
Nakano et al.

(10) Patent No.: US 9,601,589 B2
(45) Date of Patent: Mar. 21, 2017

(54) SEMICONDUCTOR DEVICE WITH SURFACE INSULATING FILM

(71) Applicant: ROHM CO., LTD., Kyoto-shi, Kyoto (JP)

(72) Inventors: Yuki Nakano, Kyoto (JP); Ryota Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/771,399

(22) PCT Filed: Mar. 4, 2014

(86) PCT No.: PCT/JP2014/055519
§ 371 (c)(1),
(2) Date: Aug. 28, 2015

(87) PCT Pub. No.: WO2014/136801
PCT Pub. Date: Sep. 12, 2014

(65) Prior Publication Data
US 2016/0020289 A1   Jan. 21, 2016

(30) Foreign Application Priority Data

Mar. 5, 2013 (JP) .................... 2013-043407

(51) Int. Cl.
*H01L 29/94* (2006.01)
*H01L 29/423* (2006.01)
(Continued)

(52) U.S. Cl.
CPC ...... *H01L 29/4236* (2013.01); *H01L 29/0657* (2013.01); *H01L 29/0661* (2013.01);
(Continued)

(58) Field of Classification Search
CPC ............ H01L 29/0692; H01L 29/7809; H01L 29/7811; H01L 29/7813
(Continued)

(56) References Cited

U.S. PATENT DOCUMENTS 6,054,752 A * 4/2000 Hara .................... H01L 29/0611
257/629
2002/0179976 A1   12/2002 Takahashi
(Continued)

FOREIGN PATENT DOCUMENTS

JP   2001-320051   11/2001
JP   2002-353456   12/2002
(Continued)

OTHER PUBLICATIONS

International Search Report, Apr. 22, 2014; PCT/JP2014/055519.
(Continued)

*Primary Examiner* — Matthew E Warren
(74) *Attorney, Agent, or Firm* — Hamre, Schumann, Mueller & Larson, P.C.

(57) ABSTRACT

A semiconductor device of the present invention includes a semiconductor layer of a first conductivity type having a cell portion and an outer peripheral portion disposed around the cell portion, and a surface insulating film disposed in a manner extending across the cell portion and the outer peripheral portion, and in the cell portion, formed to be thinner than a part in the outer peripheral portion.

23 Claims, 20 Drawing Sheets

(51) Int. Cl.

| | | |
|---|---|---|
| *H01L 29/78* | (2006.01) | |
| *H01L 29/06* | (2006.01) | |
| *H01L 29/16* | (2006.01) | |
| *H01L 29/20* | (2006.01) | |
| *H01L 29/36* | (2006.01) | |
| *H01L 29/51* | (2006.01) | |
| *H01L 29/40* | (2006.01) | |
| *H01L 29/417* | (2006.01) | |
| *H01L 29/49* | (2006.01) | |
| *H01L 29/10* | (2006.01) | |

(52) U.S. Cl.
CPC ...... *H01L 29/0688* (2013.01); *H01L 29/0692* (2013.01); *H01L 29/1602* (2013.01); *H01L 29/1608* (2013.01); *H01L 29/2003* (2013.01); *H01L 29/36* (2013.01); *H01L 29/4916* (2013.01); *H01L 29/4958* (2013.01); *H01L 29/518* (2013.01); *H01L 29/7809* (2013.01); *H01L 29/7811* (2013.01); *H01L 29/7813* (2013.01); *H01L 29/0619* (2013.01); *H01L 29/0649* (2013.01); *H01L 29/0696* (2013.01); *H01L 29/1095* (2013.01); *H01L 29/407* (2013.01); *H01L 29/41766* (2013.01); *H01L 29/4238* (2013.01); *H01L 29/42372* (2013.01); *H01L 29/42376* (2013.01); *H01L 29/4925* (2013.01)

(58) Field of Classification Search
USPC .................................. 257/77, 328, 330–334
See application file for complete search history.

(56) References Cited

U.S. PATENT DOCUMENTS

| | | | |
|---|---|---|---|
| 2003/0178673 A1 | 9/2003 | Bhalla et al. | |
| 2007/0013412 A1* | 1/2007 | Yamauchi | H01L 29/0634 |
| | | | 326/100 |
| 2011/0140197 A1 | 6/2011 | Tomita et al. | |
| 2011/0244638 A1* | 10/2011 | Kikuchi | H01L 29/402 |
| | | | 438/138 |
| 2011/0309464 A1 | 12/2011 | Yamamoto et al. | |
| 2012/0025306 A1 | 2/2012 | Tomita et al. | |
| 2012/0228637 A1 | 9/2012 | Nakabayashi et al. | |
| 2012/0261676 A1 | 10/2012 | Nakano | |
| 2013/0306983 A1 | 11/2013 | Nakano et al. | |
| 2014/0008718 A1* | 1/2014 | Toyoda | H01L 21/823412 |
| | | | 257/330 |

FOREIGN PATENT DOCUMENTS

| | | | |
|---|---|---|---|
| JP | 2007-5516 | | 1/2007 |
| JP | 2011-101036 | | 5/2011 |
| JP | 2011-124464 | | 6/2011 |
| JP | 2011-134910 | | 7/2011 |
| JP | 2011-210916 | | 10/2011 |
| JP | 2012-4312 | | 1/2012 |
| JP | 2012-9502 | | 1/2012 |
| JP | 2012004312 A | * | 1/2012 |
| JP | 2012-33802 | | 2/2012 |
| JP | 2012-60147 | | 3/2012 |
| JP | 2012-178536 | | 9/2012 |
| JP | 2012-199515 | | 10/2012 |
| JP | 2012199515 A | * | 10/2012 |

OTHER PUBLICATIONS

International Preliminary Report on Patentability and Written Opinion, and English translation, PCT/JP2014/55519, Apr. 22, 2014 (13 pages).

Co-pending U.S. Appl. No. 14/771,457, in the name of Nakano et al., filed Aug. 28, 2015.

* cited by examiner

SEMICONDUCTOR DEVICE WITH SURFACE INSULATING FILM

TECHNICAL FIELD

The present invention relates to a semiconductor device.

BACKGROUND ART

Semiconductor power devices have conventionally become the focus of attention, which are mainly used for systems in various power electronics fields such as motor control systems and power conversion systems.

As semiconductor power devices of this type, SiC semiconductor devices having a trench-gate structure have been proposed, for example.

For example, Patent Literature 1 discloses a field effect transistor including an $n^+$-type SiC substrate, an $n^-$-type epitaxial layer (drift region) formed on the SiC substrate, a p-type body region formed at a surface side of the epitaxial layer, an $n^+$-type source region formed at a surface side within the body region, a grid-shaped gate trench formed in a manner penetrating through the source region and the body region to reach the drift region, a gate insulating film formed on the inner surface of the gate trench, a gate electrode embedded in the gate trench, a source trench formed in a manner penetrating through the source region and the body region to reach the drift region at a position surrounded by the grid-shaped gate trench, and a source electrode formed in a manner entering the source trench

CITATION LIST

Patent Literature

Patent Literature 1: Japanese Patent Application Publication No. 2011-134910

SUMMARY OF INVENTION

Technical Problem

It is an object of the present invention to provide a semiconductor device capable of improving the flatness of a surface metal layer without sacrificing conventional breakdown characteristics.

Solution to Problem

A semiconductor device of the present invention includes a semiconductor layer of a first conductivity type having a cell portion and an outer peripheral portion disposed around the cell portion, and a surface insulating film disposed in a manner extending across the cell portion and the outer peripheral portion, and in the cell portion, formed to be thinner than a part in the outer peripheral portion.

According to this arrangement, selectively thinning the surface insulating film of the cell portion allows reducing a difference in level (unevenness) between a surface of the surface insulating film and a surface of the cell portion (device surface) when, for example, an opening (contact holes etc.) is formed in the surface insulating film. When metal is buried in said opening to form a surface metal layer on the surface insulating film, the flatness of the surface metal layer can thereby be improved. Thus, when, for example, a wire is bonded to the surface metal layer, adhesion between the surface metal layer and the wire can be improved. As a result, the wire can be satisfactorily bonded, so that the wire bonding portion can be improved in reliability. Further, because the surface metal layer is excellent in flatness, destruction of the device by ultrasonic vibration and pressure can be prevented at the time of wire bonding, and a decline in assembling yield can be prevented.

On the other hand, the thickness of the surface insulating film of the outer peripheral portion can be designed separately from the thickness of the surface insulating film of the cell portion. Thus, designing with such a thickness so as not to influence the electric field distribution in the outer peripheral portion allows maintaining breakdown characteristics. In other words, according to this arrangement, at the time of an improvement in flatness of the surface metal layer, variation in breakdown characteristics and a dielectric breakdown failure due to the variation can be prevented.

The semiconductor device may include a gate trench formed at a surface side of the cell portion, and a gate electrode buried in the gate trench via a gate insulating film, forming a channel at a portion lateral to the gate trench at ON-time, the outer peripheral portion may have a semiconductor surface disposed at a depth position equal to or deeper than a depth of the gate trench, and the semiconductor device may further include a voltage resistant structure having a semiconductor region of a second conductivity type formed in the semiconductor surface of the outer peripheral portion.

According to this arrangement, the voltage resistant structure can be formed at a depth position equivalent to or deeper than the depth of the gate trench. The thickness of the semiconductor layer from a bottom portion of the gate trench to a back surface of the semiconductor layer can thereby be made thicker than the thickness from the semiconductor region that constitutes a voltage resistant structure to said back surface. As a result, an electric field imposed on a section between the surface side and back surface side of the semiconductor layer can be made to be stably shared by the voltage resistant structure. Because a stable electric field distribution can accordingly be formed in the semiconductor layer without depending on the depth of the gate trench, an electric field concentration to the bottom portion of the gate trench can be satisfactorily relaxed.

The semiconductor device may further include a gate finger to make contact with the gate electrode, and the gate trench may include a line-shaped trench that runs across the gate finger under the gate finger.

According to this arrangement, because trench corner portions (for example, corners etc., in crossing portions of a grid-shaped trench) where an electric field is likely to concentrate when a gate voltage is applied are not disposed under the gate finger, the reliability and resistance of the gate insulating film can be improved.

The gate trench may include an inner trench at a portion lateral to which the channel is formed at ON-time, and an outer trench constituted of an extension portion of the inner trench, disposed outside with respect to the inner trench, and the semiconductor device may further include a second conductivity type-layer formed at side and bottom portions of the outer trench.

According to this arrangement, a depletion layer can be generated, by a second conductivity-type layer different in conductivity type from the semiconductor layer, from a junction (p-n junction) between said second conductivity-type layer and the semiconductor layer. Moreover, because the depletion layer keeps equipotential surfaces away from the outer trench, electric fields to be imposed on the bottom portion of the outer trench can be further relaxed. Breakdown in the bottom portion of the outer trench can accordingly be prevented.

The semiconductor device may further include a gate finger to make contact with the gate electrode, the gate trench may be selectively formed in a region under the gate finger, and the semiconductor device may further include a high-concentration layer of a first conductivity type formed in a semiconductor surface of the semiconductor layer where the gate trench is not formed in the region under the gate finger, containing an impurity at a higher concentration than that of the semiconductor layer.

According to this arrangement, the oxidation rate of the high-concentration layer having a high impurity concentration can be made fast as compared with that of the semiconductor layer having a lower concentration than that high impurity concentration. Thus, when the gate insulating film is formed by thermal oxidation, a thick oxide film can be selectively formed in an upper portion of the gate trench in a region under the gate finger. An electric field to be imposed on an upper edge of the gate trench when a gate voltage is applied can thereby be weakened to prevent a dielectric breakdown of the gate insulating film.

The cell portion may include a source region of a first conductivity type disposed in a manner exposed on a surface of the semiconductor layer, a channel region of a second conductivity type which is disposed in a manner contacting the source region and in which the channel is formed at ON-time, a drain region of a first conductivity type disposed in a manner contacting the channel region, a second trench selectively formed in a source portion defined in a manner including the source region in the surface of the semiconductor layer, and a channel contact region of a second conductivity type selectively disposed at a bottom portion of the second trench, electrically connected with the channel region.

The cell portion may include a source region of a first conductivity type disposed in a manner exposed on a surface of the semiconductor layer, a channel region of a second conductivity type which is disposed in a manner contacting the source region and in which the channel is formed at ON-time, a drain region of a first conductivity type disposed in a manner contacting the channel region, a second trench selectively formed in a source portion defined in a manner including the source region in the surface of the semiconductor layer, a trench buried portion buried in the second trench, and a channel contact region of a second conductivity type selectively disposed at a position higher than that of a bottom portion of the second trench in the source region, electrically connected with the channel region.

According to this arrangement, a concentration of equipotential surfaces in a vicinity of the bottom portion of the gate trench can be prevented by the second trench, so that a potential gradient, for example, in the vicinity of the bottom portion can be made gradual. Therefore, an electric field concentration to the bottom portion of the gate trench can be relaxed.

Also, because the trench buried portion is buried in the second trench, a difference in level (unevenness) between the source portion and other parts can be reduced on the surface of the semiconductor layer (device surface). When a surface metal layer is formed on said device surface, the flatness of the surface metal layer can thereby be improved. Thus, when, for example, a wire is bonded to the surface metal layer, adhesion between the surface metal layer and the wire can be improved. As a result, the wire can be satisfactorily bonded, so that the wire bonding portion can be improved in reliability. Further, because the surface metal layer is excellent in flatness, destruction of the device by ultrasonic vibration and pressure can be prevented at the time of wire bonding, and a decline in assembling yield can be prevented.

Further, because the channel contact region is disposed at a position higher than that of the bottom portion of the second trench, even when there is formed a second trench, contact with the channel region can be reliably made via the channel contact region. In other words, at the time of an improvement in flatness of the surface metal layer, a degradation in device performance such as gate withstand voltage and contact performance with the channel region can be prevented.

The trench buried portion may consist of an insulating film formed on an inner surface of the second trench and a polysilicon layer buried inside of the insulating film.

According to this arrangement, the polysilicon layer buried in the second trench can be used as an etching stopper, in the case where, for example, there is formed a surface insulating film made of $SiO_2$ on the surface of the semiconductor layer, when selectively etching the surface insulating film to expose the source portion from a contact hole. Therefore, control of the step of said contact etching can be simplified.

The insulating film may be made of any of $SiO_2$, AlON, $Al_2O_3$, $SiO_2$/AlON, $SiO_2$/AlON/$SiO_2$, $SiO_2$/SiN, and $SiO_2$/SiN/$SiO_2$.

According to this arrangement, by, for example, forming the gate insulating film in the same step as that for the insulating film in the second trench, a gate insulating film constituted of a material exemplified in the above can be provided. In this case, providing a gate insulating film constituted of a high-dielectric-constant (high-k) film of AlON, $Al_2O_3$, or the like allows an improvement in gate withstand voltage, so that device reliability can be improved.

The insulating film may have a $SiO_2$ film containing nitrogen (N).

According to this arrangement, by, for example, forming the gate insulating film in the same step as that for the insulating film in the second trench, a gate insulating film constituted of a material having a $SiO_2$ film containing nitrogen (N) can be provided. This gate insulating film can improve channel mobility.

The insulating film may be, at the bottom portion of the second trench, formed to be thicker than a part at a side portion of the second trench.

According to this arrangement, by, for example, forming the gate insulating film in the same step as that for the insulating film in the second trench, the gate insulting film can also be made, for example, at the bottom portion of the gate trench, thicker than a part at a side portion of the gate trench. Withstand voltage in the bottom portion of the gate trench can thereby be improved.

The polysilicon layer may be made of $n^+$-type polysilicon.

According to this arrangement, by, for example, forming the gate electrode in the same step as that for the polysilicon layer in the second trench, a gate electrode constituted of $n^+$-type polysilicon can be provided. The $n^+$-type polysilicon has a relatively low sheet resistance, which therefore allows increasing transistor switching speed.

The trench buried portion may consist of an insulating layer that fills back the second trench.

According to this arrangement, because the inside of the second trench is filled with the insulating layer, a leakage current that flows via the second trench can be prevented or reduced.

The insulating layer may be made of $SiO_2$. In this case, the insulating layer may be made of $SiO_2$ containing phosphorus (P) or boron (B).

According to this arrangement, because the melting point of $SiO_2$ falls as a result of containing phosphorous or boron, the process for burying the insulating film can be simplified. As such $SiO_2$, for example, PSG (phosphorus silicate glass) or PBSG (phosphorus boron silicate glass) can be used.

The trench buried portion may consist of a polysilicon layer that fills back the second trench.

According to this arrangement, the polysilicon layer buried in the second trench can be used as an etching stopper, in the case where, for example, there is formed a surface insulating film made of $SiO_2$ on the surface of the semiconductor layer, when selectively etching the surface insulating film to expose the source portion from a contact hole. Therefore, control of the step of said contact etching can be simplified.

The polysilicon layer may be made of $p^+$-type polysilicon.

According to this arrangement, when, for example, the channel region and the channel contact region are p-type, these regions can be electrically connected by use of a $p^+$-type polysilicon layer. Because the length of a current path between the channel region and the channel contact region can thereby be reduced, a base resistance therebetween can be reduced. As a result, latch-up can be satisfactorily prevented. Further, when the channel contact region is in contact with the polysilicon layer, a contact resistance therebetween can also be reduced. The reduction in contact resistance also contributes to a reduction in the base resistance between the channel region and the channel contact region.

The semiconductor device of the present invention may further include a second conductivity-type layer formed at the bottom portion and a side portion of the second trench in a manner continuing from the channel region and the channel contact region.

According to this arrangement, a depletion layer can be generated, by a second conductivity-type layer different in conductivity type from the semiconductor layer, from a junction (p-n junction) between said second conductivity-type layer and the semiconductor layer. Moreover, because the depletion layer keeps equipotential surfaces away from the gate trench, electric fields to be imposed on the bottom portion of the gate trench can be further relaxed.

The gate electrode may include a base film made of polysilicon formed on an inner surface of the gate trench, and a buried metal containing at least one of Mo, W, Al, Pt, Ni, and Ti buried inside of the base film.

According to this arrangement, the buried metal can make gate resistance relatively low, which therefore allows increasing transistor switching speed.

The semiconductor device may further include a surface metal layer made of a metal containing copper (Cu) disposed at a surface side of the semiconductor layer. In this case, as in the invention described in claim 21, the surface metal layer may contain an Al—Cu-based alloy.

According to this arrangement, because the sheet resistance of the surface metal layer can be reduced, the current density can be increased.

In the cell portion, a plurality of unit cells may be defined in a grid shape by the gate trench, or may be defined in a striped shape by the gate trench.

The semiconductor layer may be made of SiC, GaN, or diamond.

DESCRIPTION OF PREFERRED EMBODIMENTS

First Preferred Embodiment

Hereinafter, preferred embodiments of the present invention will be described in detail with reference to the accompanying drawings.

Figure 1:
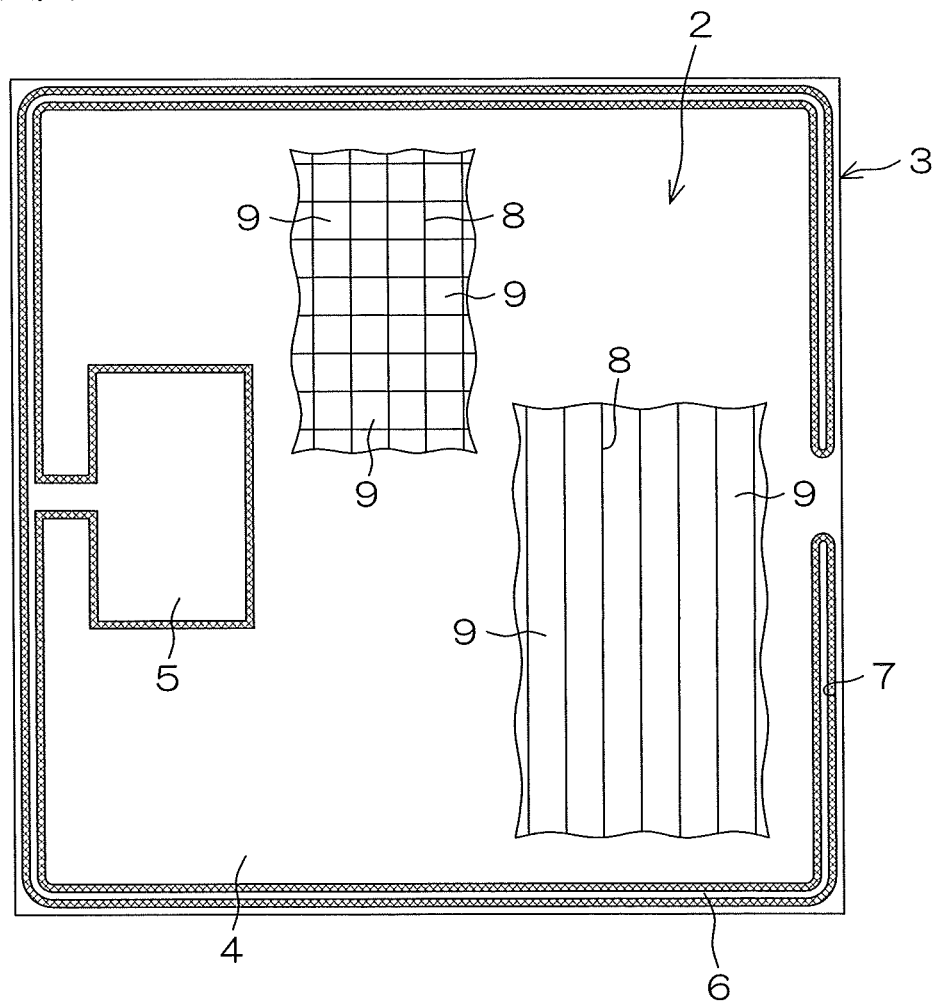
FIG. 1 is a schematic plan view of a semiconductor device according to a first preferred embodiment of the present invention.

FIG. 1 is a schematic plan view of a semiconductor device according to a first preferred embodiment of the present invention.

The semiconductor device 1 includes a SiC-based MISFET (Metal Insulator Semiconductor Field Effect Transistor). As shown in FIG. 1, the semiconductor device 1 has, for example, a square chip-shaped contour in a plan view. The chip-shaped semiconductor device 1 is sized to have a vertical and horizontal length of about several millimeters in the illustration of FIG. 1. A cell portion 2 and an outer peripheral portion 3 disposed around the cell portion 2 are set on the semiconductor device 1. The outer peripheral portion 3 is, in the present preferred embodiment, formed in an annular shape in a manner surrounding the cell portion 2, but the outer peripheral portion 3 need not particularly be an annular shape as long as it is a region at an outer side of the chip with respect to the cell portion 2.

The semiconductor device 1 includes a source pad 4, a gate pad 5, and a gate finger 6.

The source pad 4 is disposed in a region over the cell portion 2. In the present preferred embodiment, the source pad 4 is formed in, for example, a square shape in a plan view in a manner covering substantially the whole of the cell portion 2. In a peripheral edge portion of the source pad 4, a removal region 7 (cross-hatched part in FIG. 1) that surrounds a central region of the source pad 4 is formed along the outer peripheral portion 3. The removal region 7 is selectively recessed at a part thereof toward the central region of the source pad 4. The recess is disposed in its entirety in a region over the cell portion 2, and has the gate pad 5 installed therein.

The gate finger 6 extends, in a position closer to the outer peripheral portion 3 with respect to a boundary between the cell portion 2 and the outer peripheral portion 3, from the gate pad 5 across the entire removal region 7 along the outer peripheral portion 3. In the present preferred embodiment, a pair of gate fingers 6 are formed in a shape symmetrical with respect to the gate pad 5. Moreover, in the present preferred embodiment, the boundary (the same as the boundary L in FIG. 2) between the cell portion 2 and the outer peripheral portion 3 described above is set, for example, along an inner part with respect to the gate fingers 6 of the removal region 7.

The cell portion 2 is further formed with a gate trench 8. The gate trench 8 is, in the present preferred embodiment, selectively formed in a region under the source pad 4 in a manner avoiding a region under the gate pad 5. In this region, the gate trench 8 is formed in a manner defining a plurality of unit cells 9. The gate trench 8 may be patterned in, as shown in FIG. 1, a grid shape or in a striped shape. A large number of unit cells 9 are thereby regularly arrayed in a matrix shape (in an array) or a striped shape (linearly) in the cell portion 2. Although, this is not shown, the unit cells 9 may be patterned in another shape such as a honeycomb shape.

Next, an internal structure of the cell portion 2 and the outer peripheral portion 3 of the semiconductor device 1 will be described.

Figure 2:
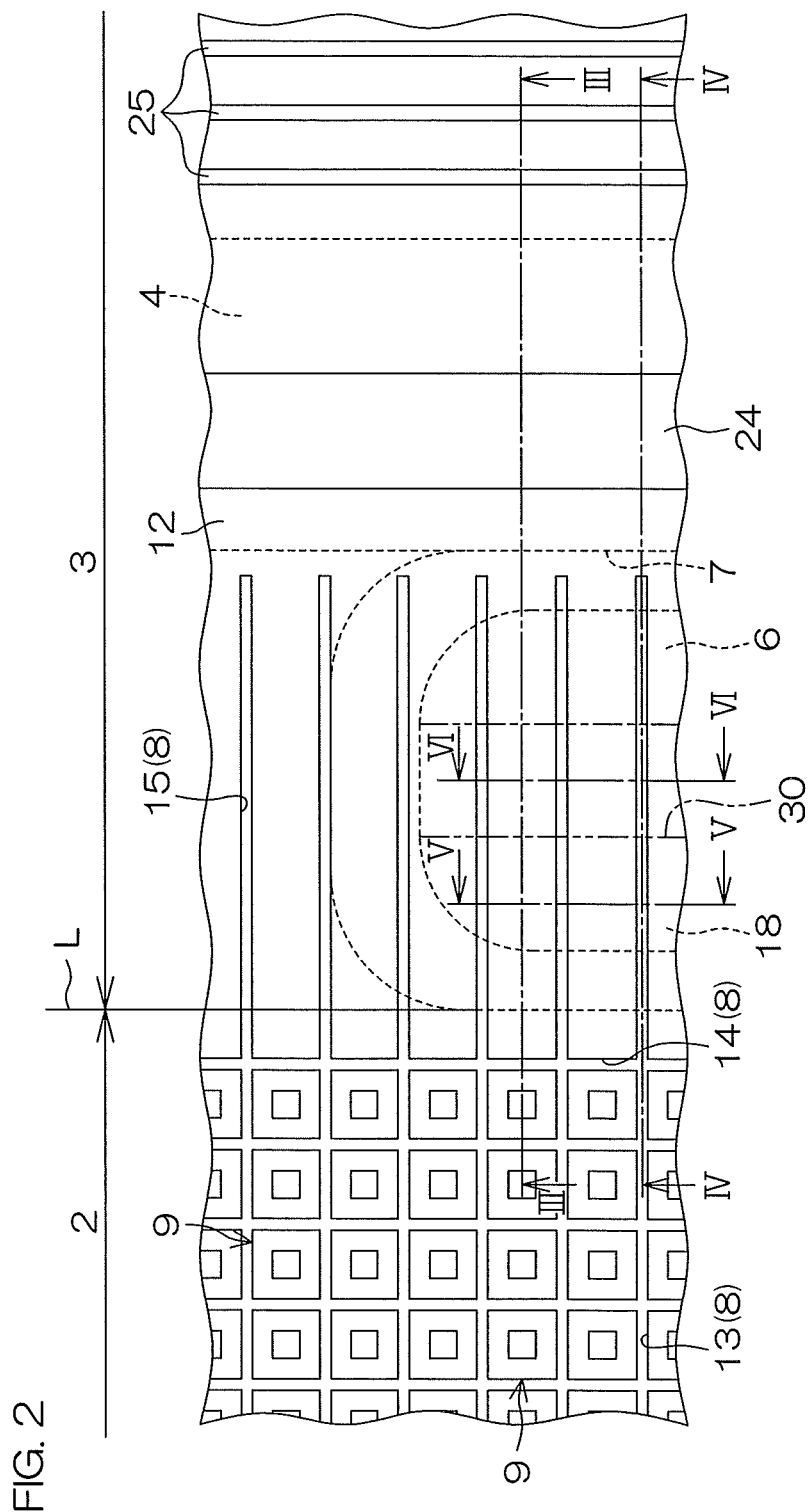
FIG. 2 is an enlarged view showing a main part of FIG. 1, in which a part is shown perspectively.
Figure 3:
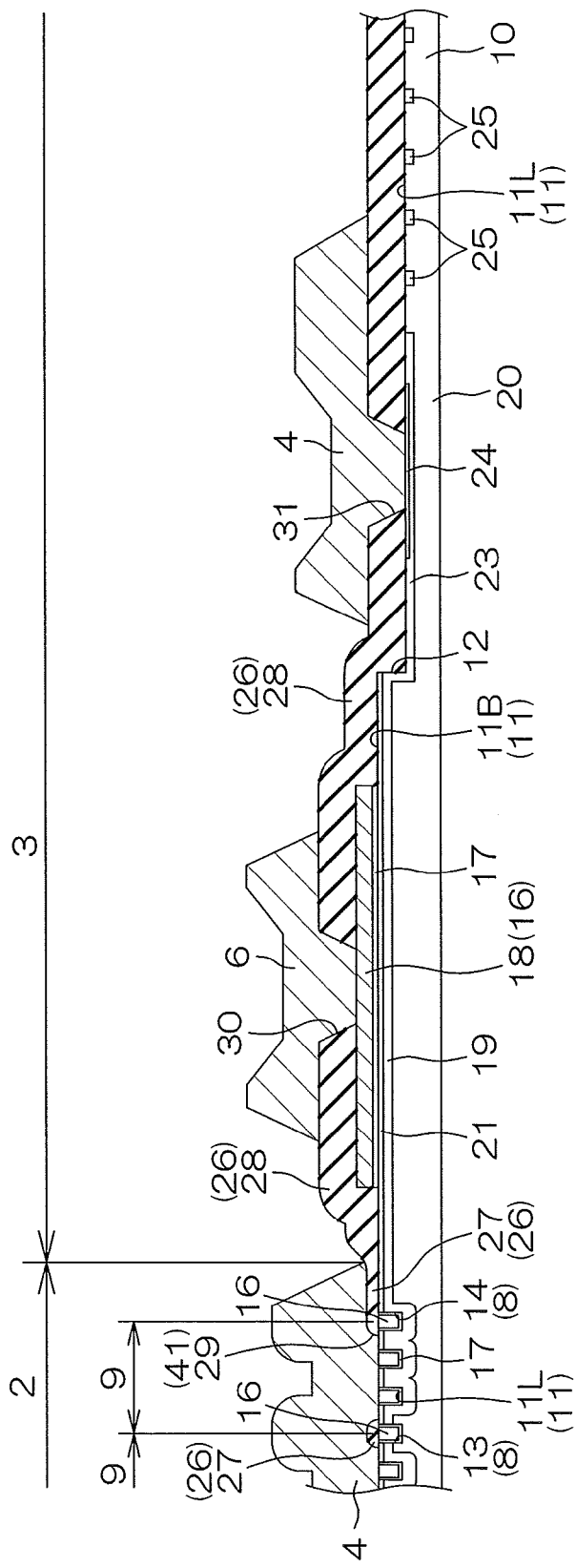
FIG. 3 shows a sectional structure of the semiconductor device in a section taken along of FIG. 2.
Figure 4:
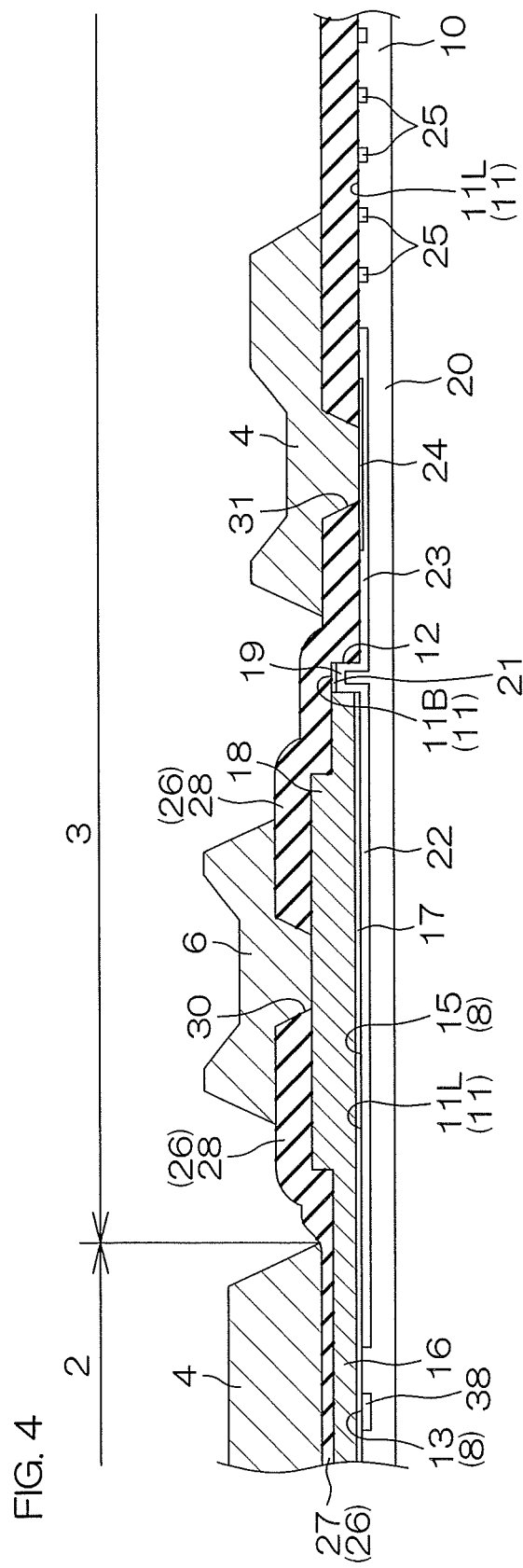
FIG. 4 shows a sectional structure of the semiconductor device in a section taken along IV-IV of FIG. 2.
Figure 5:
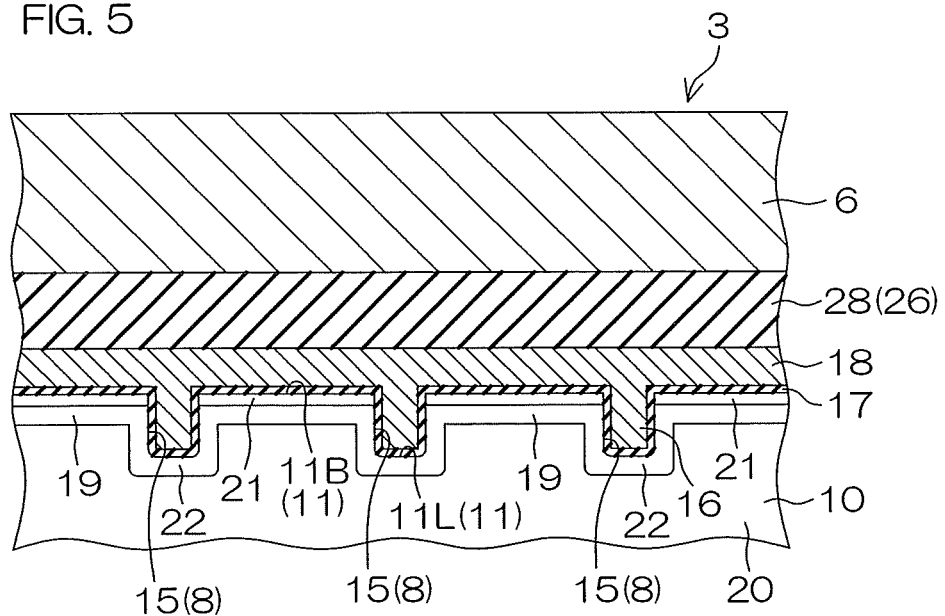
FIG. 5 shows a sectional structure of the semiconductor device in a section taken along V-V of FIG. 2.
Figure 6:
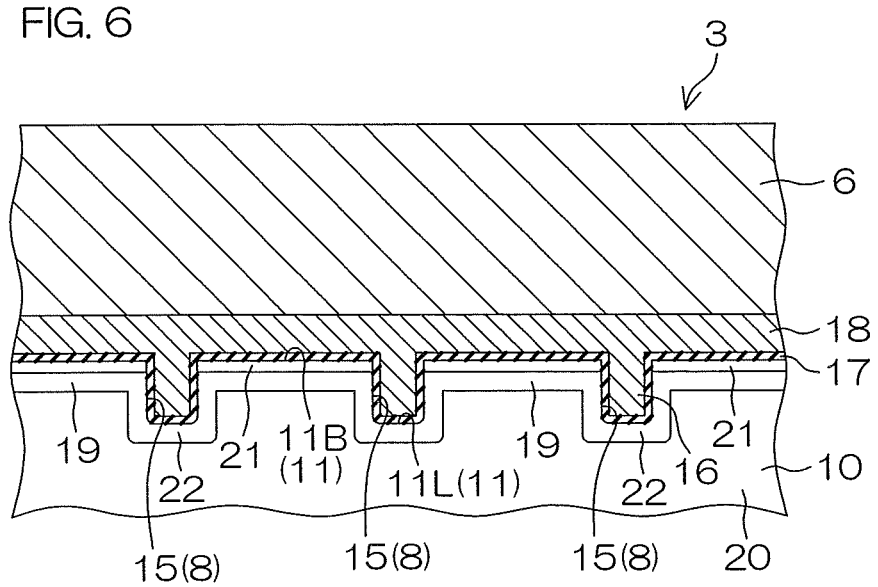
FIG. 6 shows a sectional structure of the semiconductor device in a section taken along VI-VI of FIG. 2.

FIG. 2 is an enlarged view showing a main part of FIG. 1, in which a part is shown perspectively. Specifically, a structure in a region under the source pad 4 and the gate fingers 6 is shown by solid lines, and the source pad 4 and the gate fingers 6 are shown by broken lines. FIG. 3 shows a sectional structure of the semiconductor device in a section taken along III-III of FIG. 2. FIG. 4 shows a sectional structure of the semiconductor device in a section taken along IV-IV of FIG. 2. FIG. 5 shows a sectional structure of the semiconductor device in a section taken along V-V of FIG. 2. FIG. 6 shows a sectional structure of the semiconductor device in a section taken along VI-VI of FIG. 2.

The semiconductor device 1 includes a substrate (not shown) made of n$^+$-type SiC (for example, having a concentration of $1\times10^{18}$ to $1\times10^{21}$ cm$^{-3}$) and an n$^-$-type epitaxial layer 10 made of n$^-$-type SiC (for example, having a concentration of $1\times10^{15}$ to $1\times10^{17}$ cm$^{-3}$) formed on the substrate. The n$^-$-type epitaxial layer 10 is a layer formed by causing SiC to epitaxially grow on a surface of the substrate. In the present preferred embodiment, the substrate and the n$^-$-type epitaxial layer 10 are shown as an example of a semiconductor layer of the present invention. Also, the substrate has a thickness of, for example, about 250 µm to 350 µm, and the n$^-$-type epitaxial layer 10 has a thickness of about 3 µm to 20 µm.

The n$^-$-type epitaxial layer 10 has a semiconductor surface 11 with a difference in height formed by being selectively dug down at a part thereof. The difference in height of the semiconductor surface 11 is, in the present preferred embodiment, formed by the gate trench 8 and source trenches 33 (described later) selectively formed in the cell portion 2 and the outer peripheral portion 3 and a low step portion 12 selectively formed in the outer peripheral portion 3. In the following, the semiconductor surface 11 where the gate trench 8, the source trenches 33, and the low step portion 12 are not formed and which is maintained at a height position after epitaxial growth is provided as a base surface 11B, and like a bottom face of the gate trench 8, a bottom face of the source trench 33, and a bottom face of the low step portion 12, the semiconductor surface 11 formed at a relatively low height position with respect to the base surface 11B is provided as a lower surface 11L.

The gate trench 8, in the present preferred embodiment, includes an inner trench 13 that is used as the gate of a MISFET, an outer trench 14 disposed on an outer side with respect to the inner trench 13, and a contact trench 15 that is pulled out from the outer trench toward the outer peripheral portion 3 to serve as a contact with a gate electrode 16 (described later). The trenches 13 to 15 are integrally formed in a manner communicating with each other.

As shown in FIG. 2, the inner trench 13 is formed in a grid shape by a plurality of line-shaped trenches crossing each other in a manner defining a plurality of unit cells 9. Terminal portions of the respective lines of the inner trench 13 are connected to each other by the outer trench 14. In other words, the outer trench 14 is formed in a manner surrounding the inner trench 13, and extends across between the terminal portions of mutually adjacent lines of the inner trench 13.

The contact trenches 15 are formed in line shapes constituted of extension portions of the respective lines of the inner trench 13, and disposed in plural numbers, spaced apart from each other, along the boundary L between the cell portion 2 and the outer peripheral portion 3. In addition, the contact trenches 15 need not be provided for every line of the inner trench 13, and may be provided, for example, for every other line of the inner trench 13. The line-shaped contact trenches 15 are formed in a manner running across the gate fingers 6 in a region under the gate fingers 6. In the present preferred embodiment, the contact trenches 15 have their terminal portions disposed further outside than the gate fingers 6. In other words, the terminal portions of the contact trenches 15 are sticking out further outside than the gate fingers 6.

Moreover, in the gate trench 8, a gate electrode 16 made of, for example, polysilicon is buried, and a gate insulating film 17 is interposed between the gate electrode 16 and the n$^-$-type epitaxial layer 10.

The gate electrode 16 is, for example, as shown in FIG. 3 and FIG. 4, buried up to the base surface 11B in the inner trench 13 and the outer trench 14 formed at positions separated from a region under the gate fingers 6. The gate electrode 16 is thereby also formed in a grid shape, and an upper face of the respective unit cells 9 is exposed without being covered with the gate electrode 16. On the other hand, in the contact trenches 15 formed in a region under the gate fingers 6, the gate electrode 16 has an overlapping portion 18 formed from an opening end of the contact trench 15 in a manner selectively covering the base surface 11B. The overlapping portion 18 is, in the present preferred embodiment, as shown in FIG. 2, formed along the gate fingers 6 in a manner running across the line-shaped contact trenches 15. As shown in FIG. 5 and FIG. 6, also between the overlapping portion 18 and the n⁻-type epitaxial layer 10, a gate insulating film 17 is interposed.

In the cell portion 2, the gate electrode 16 controls formation of an inversion layer (channel) in the unit cell 9. That is, the semiconductor device 1 has a so-called trench-gate type structured MISFET.

The low step portion 12 is, in the present preferred embodiment, formed across the entire circumference of the outer peripheral portion 3, and thereby surrounds the cell portion 2. The low step portion 12 is formed with a depth equal to or deeper than a depth of the gate trench 8. Thus, in the outer peripheral portion 3, the bottom face (lower surface 11L) of the low step portion 12 is formed at a depth position equal to or deeper than that of the bottom face (lower surface 11L) of the gate trench 8. That depth is, for example, 0.7 μm to 5 μm with reference to the base surface 11B, relative to the depth of the gate trench 8 of 0.7 μm to 3 μm.

Moreover, in the semiconductor surface 11 having such a difference in height, n-type and p-type impurity regions are selectively formed.

Specifically, in a surface portion of the n⁻-type epitaxial layer 10, a p-type well 19 (for example, having a concentration of $1\times10^{16}$ to $1\times10^{19}$ cm$^{-3}$) is formed in a manner extending across the cell portion 2 and the outer peripheral portion 3. On the other hand, a region of a portion under the p-type well 19 in the n⁻-type epitaxial layer 10 is an n⁻-type drain region 20. In the present preferred embodiment, as shown in FIG. 3, the p-type well 19 is continuously formed, from the cell portion 2 to the low step portion 12 of the outer peripheral portion 3 via a region under the gate fingers 6, in such a manner that its bottom portion follows the base surface 11B. The p-type well 19 is thereby exposed at a side portion of the low step portion 12.

In the p-type well 19, as shown in FIG. 3, FIG. 5, and FIG. 6, an n⁺-type region 21 is formed in a region under the gate fingers 6, and exposed on the base surface 11B of the n⁻-type epitaxial layer 10. The n⁺-type region 21 is a high concentration region (for example, having a concentration of $1\times10^{18}$ to $1\times10^{21}$ cm$^{-3}$) containing an n-type impurity at a higher concentration than that of the n⁻-type epitaxial layer 10. In the present preferred embodiment, as shown in FIG. 3, the n⁺-type region 21 is continuously formed, from the cell portion 2 to the low step portion 12 of the outer peripheral portion 3 via a region under the gate fingers 6, in such a manner that its bottom portion follows the base surface 11B. The n⁺-type region 21 is thereby exposed at a side portion of the low step portion 12.

In the n⁻-type epitaxial layer 10, as shown in FIG. 4 to FIG. 6, a p-type layer 22 (for example, having a concentration of $1\times10^{16}$ to $1\times10^{19}$ cm$^{-3}$) is formed in a region under the gate fingers 6 in a manner continuing from the p-type well 19. The p-type layer 22 is, in the present preferred embodiment, formed in a manner extending across a bottom portion and side portion (including a side portion of the terminal portion) of the contact trench 15, and its inner region is in contact with the contact trench 15 (exposed into the contact trench 15). Also, the p-type layer 22 is, at the bottom portion of the contact trench 15, formed to be thicker than a part at a side portion of the contact trench 15.

Also, in the n⁻-type epitaxial layer 10, as shown in FIG. 3 and FIG. 4, a p-type layer 23 (for example, having a concentration of $1\times10^{16}$ to $1\times10^{19}$ cm$^{-3}$) serving as an example of a voltage resistant structure of the present invention is formed in the low step portion 12 in a manner continuing from the p-type well 19. The p-type layer 23 is, in the present preferred embodiment, formed in a manner extending across a bottom portion and side portion of the low step portion 12, and its inner region is in contact with the low step portion 12 (exposed into the low step portion 12). In a surface portion of the p-type layer 23, a p⁺-type well contact region 24 (for example, having a concentration of $1\times10^{18}$ to $1\times10^{21}$ cm$^{-3}$) is formed. In the present preferred embodiment, the p⁺-type well contact region 24 is formed in the lower surface 11L of the low step portion 12, and formed in an annular shape in a manner surrounding the cell portion 2.

Also, outside of the p-type layer 23 in the low step portion 12, a p-type guard ring 25 (for example, having a concentration of $1\times10^{16}$ to $1\times10^{19}$ cm$^{-3}$) serving as an example of a voltage resistant structure of the present invention is formed. In the present preferred embodiment, the p-type guard rings 25 are formed in plural numbers, spaced apart from each other, in a manner surrounding the cell portion 2 in the lower surface 11L of the low step portion 12.

On a surface of the n⁻-type epitaxial layer 10, a surface insulating film 26 is formed in a manner extending across the cell portion 2 and the outer peripheral portion 3. The surface insulating film 26 is made of an insulator such as silicon oxide ($SiO_2$), for example. The surface insulating film 26 is, in the present preferred embodiment, formed such that an inner part 27 on the cell portion 2 becomes thinner than an outer part 28 on the outer peripheral portion 3. In the present preferred embodiment, the inner part 27 has a thickness of 5000 Å or less, and the outer part 28 has a thickness of about 5500 Å to 20000 Å. The surface insulating film 26 may be called an interlayer insulating film when a multilayer wiring structure is disposed thereon, which is not shown in FIG. 2.

In the surface insulating film 26, contact holes 29 to 31 that selectively expose the respective unit cells 9, the gate electrode 16 (overlapping portion 18), and the p⁺-type well contact region 24, respectively, are formed over the entire surface of the n⁻-type epitaxial layer 10.

On the surface insulating film 26, the source pad 4 and the gate fingers 6 are formed.

The source pad 4 is connected collectively to p⁺-type channel contact regions 34 (described later) and n⁺-type source regions 32 (described later) of all unit cells 9 and the p⁺-type well contact region 24 via the respective contact holes 29 and 31. In other words, the source pad 4 serves as a common electrode to all unit cells 9. Also, as the material for the source pad 4, a metal containing copper (Cu) can be used, and more preferably, a metal containing an Al—Cu-based alloy is used. Because the sheet resistance of the source pad 4 can thereby be reduced, the current density can be increased. Also, the source pad 4 has a thickness (distance from the base surface 11B of the n⁻-type epitaxial layer 10 to a surface of the source pad 4) of, for example, 4 μm to 5 μm. In addition, the source pad 4 may have a contact metal made of, for example, a laminated structure (Ti/TiN) of titanium (Ti) and titanium nitride (TiN) at a connection part with the n⁻-type epitaxial layer 10.

The gate fingers 6 are connected to the gate electrode 16 (overlapping portion 18) via the contact hole 30. Also, as the material for the gate fingers 6 and the gate pad 5, similar to that for the source pad 4, a metal containing copper (Cu) can be used, and more preferably, a metal containing an Al—Cu-based alloy is used. Using the same material as that for the source pad 4 allows simultaneously forming the source pad 4, the gate pad 5, and the gate fingers 6.

Figure 7:
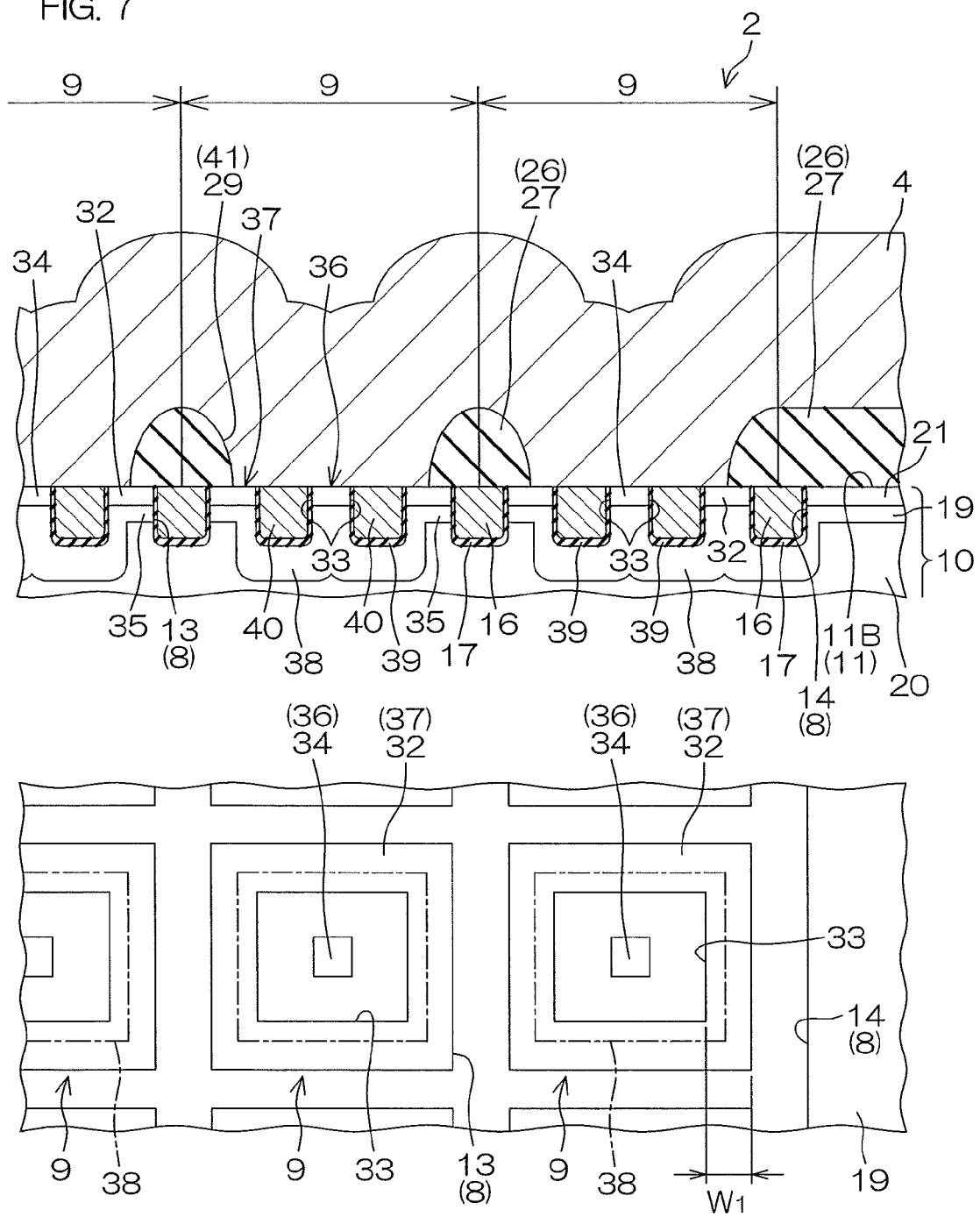
FIG. 7 is a view showing a cell portion in FIG. 3 in an enlarged manner.

Next, the structure of the cell portion 2 will be described in greater detail. FIG. 7 is a view showing the cell portion 2 in FIG. 3 in an enlarged manner.

In the cell portion 2, as described above, the plurality of unit cells 9 each of which performs a transistor operation are defined in a grid shape by the gate trench 8 (inner trench 13 and outer trench 14). Each unit cell 9 includes an annular $n^+$-type source region 32, an annular source trench 33 (second trench) surrounded by the $n^+$-type source region 32, and a $p^+$-type channel contact region 34 formed in an island shape inside the source trench 33. The $p^+$-type channel contact region 34 is surrounded by the source trench 33 at its periphery. Also, each unit cell 9 is sized to have a vertical and horizontal length of, for example, about 3 μm to 10 μm in the illustration of FIG. 7.

Specifically, an $n^+$-type source region 32 is formed in a surface portion of the p-type well 19 in the cell portion 2, and exposed on the base surface 11B of the $n^-$-type epitaxial layer 10. In addition, a part within the cell portion 2 of the p-type well 19 is a p-type channel region 35 which is disposed in a manner contacting the $n^+$-type source region 32 and in which a channel is formed at the time of a transistor operation.

Moreover, the gate trench 8 and the source trench 33 are formed in a manner penetrating through the $n^+$-type source region 32 and the p-type channel region 35 (p-type well 19) to reach the $n^-$-type drain region 20. The gate trench 8 and the source trench 33 are, in the present preferred embodiment, formed with the same width and the same depth, but may be different in depth from each other. For example, the source trench 33 may be shallower or may be deeper than the gate trench 8.

Each unit cell 9 is separated into a prismatic portion 36 surrounded by the source trench 33 and an annular portion 37 disposed between the source trench 33 and the gate trench 8 and spaced apart from the prismatic portion 36 by the source trench 33. In the present preferred embodiment, the width $W_1$ of the annular portion 37 (distance between the source trench 33 and the gate trench 8) is, for example, 0.5 μm to 2.0 μm.

In a top portion of the prismatic portion 36, a $p^+$-type channel contact region 34 (for example, having a concentration of $1 \times 10^{18}$ to $1 \times 10^{21}$ cm$^{-3}$) is formed in a manner exposed on the base surface 11B of the $n^-$-type epitaxial layer 10. Accordingly, the $p^+$-type channel contact region 34 forms a part of the side face of the source trench 33. The $p^+$-type channel contact region 34, in the present preferred embodiment, has its deepest portion at a position higher than that of a bottom portion of the source trench 33, but the deepest portion is not particularly necessary at this position. As long as an uppermost portion of the $p^+$-type channel contact region 34 (in the present preferred embodiment, the part exposed on the base surface 11B of the $n^-$-type epitaxial layer 10) is at a position higher than that of the bottom portion of the source trench 33 and is contactable, said deepest portion may be at the same depth position as that of the bottom portion of the source trench 33 or may be deeper.

In the annular portion 37, an $n^+$-type source region 32 and a p-type channel region 35 are formed in order from the base surface 11B side. Accordingly, the $n^+$-type source region 32 and the p-type channel region 35 form parts of the side face of the gate trench 8, respectively. The $n^+$-type source region 32 is, in the present preferred embodiment, formed with the same depth as that of the $n^+$-type region 21 (refer to FIG. 3 to FIG. 6) and the $n^+$-type channel contact region 34.

Also, in the $n^-$-type epitaxial layer 10, a p-type layer 38 (for example, having a concentration of $1 \times 10^{16}$ to $1 \times 10^{19}$ cm$^{-3}$) is formed in a manner continuing from the p-type channel region 35 and the $p^+$-type channel contact region 34 and the p-type layer 22 (refer to FIG. 4 to FIG. 6) described above. The p-type layer 38 is formed in a manner extending across the prismatic portion 36 and the annular portion 37 via the bottom portion of the source trench 33, and its inner region is in contact with the source trench 33 (exposed into the source trench 33). The p-type layer 38 is connected to the p-type channel region 35 at a portion lateral to the source trench 33 of the annular portion 37, and is connected to the $p^+$-type channel contact region 34 at a portion lateral to the source trench 33 of the prismatic portion 36. Thus, the p-type channel region 35 and the $p^+$-type channel contact region 34 are electrically connected via the p-type layer 38.

Also, the p-type layer 38 is also formed in a manner extending across outer peripheral edges of the outer trench 14 via a bottom portion of the outer trench 14, and is connected, at the outer peripheral edges, to the p-type well 19 extending to the outer peripheral portion 3. Also, the p-type layer 38 may be, as shown in FIG. 2 and FIG. 4, in the inner trench 13, formed only in crossing portions of the lines that constitute the inner trench 13. In addition, the crossing portions of the inner trench 13 correspond to corner portions of each unit cell 9, and no channel is formed there at ON-time, or if formed, a small current flows through the channel. Thus, even if the p-type layer 38 is formed in said crossing portions in a manner connected to the p-type channel region 35, there is virtually no influence on the device performance.

Also, the p-type layer 38 is, similar to the p-type layer 22, at bottom portions of the gate trench 8 and the source trench 33, formed to be thicker than a part at a side portion of the source trench 33. However, in the prismatic portion 36, a portion lateral to the source trench 33 is surrounded by the source trench 33, and ion implantation is uniformly performed from its periphery. Therefore, the p-type layer 38 is formed thicker than the part at the bottom portion of the source trench 33, so as to fill a part under the $p^+$-type channel contact region 34.

Also, the p-type layer 38 is, in the present preferred embodiment, in a part other than the crossing portions of the inner trench 13 and the outer trench 14, formed across the entire periphery of the annular portion 37 surrounded by the gate trench 8, in a manner not contacting the gate trench 8 (spaced apart from the gate trench 8). Accordingly, an $n^-$-type drain region 20 is disposed at a part of the side face of the gate trench 8 in each unit cell 9, so that a current path at the time of channel formation can be secured.

The gate trench 8 is, in the present preferred embodiment, formed in a substantially U-shape in a sectional view having a side face and a bottom face. On an inner surface (side face and bottom face) of the gate trench 8, a gate insulating film 17 is formed such that its one surface and the other surface extend along the inner surface of the gate trench 8.

The gate insulating film 17 is, at the bottom portion of the gate trench 8, formed to be thicker than a part at a side portion of the gate trench 8. In the gate trench 8 having a substantially U-shape in a sectional view as in the present preferred embodiment, the relatively thick part of the gate insulating film 17 is a part that contacts the bottom face of the gate trench 8, and the relatively thin part is a part that contacts the side face of the gate trench 8. By making the insulating film thick at the bottom portion of the gate trench 8 where electric field concentration is likely to occur, withstand voltage in the bottom portion of the gate trench 8 can be improved. In addition, the side face and bottom face sometimes cannot be clearly distinguished depending on the shape of the gate trench 8, but in that case, it suffices that the gate insulating film 17 that contacts a face in a direction crossing the depth direction of the gate trench 8 is relatively thick.

Moreover, the inside of the gate insulating film 17 is filled back with a gate electrode 16. In the present preferred embodiment, the gate electrode 16 is buried in the gate trench 8 such that its upper face becomes substantially flush with the base surface 11B of the n⁻-type epitaxial layer 10. The gate electrode 16 is opposed to the p-type channel region 35 via the gate insulating film 17. In each unit cell 9, by controlling a voltage to be applied to the gate electrode 16, an annular channel along the periphery of the unit cell 9 is formed in the p-type channel region 35. Then, a drain current that flows along the side face of the gate trench 8 toward the base surface 11B of the n⁻-type epitaxial layer 10 can be caused to flow to the n⁺-type source region 32 via the channel. A transistor operation of the semiconductor device 1 is thereby performed.

Similarly, the source trench 33 is also, in the present preferred embodiment, formed in a substantially U-shape in a sectional view having a side face and a bottom face. On an inner surface (side face and bottom face) of the source trench 33, a source trench insulating film 39 is formed such that its one surface and the other surface extend along the inner surface of the source trench 33.

The source trench insulating film 39 is, at the bottom portion of the source trench 33, formed to be thicker than a part at a side portion of the source trench 33. In addition, the side face and bottom face sometimes cannot be clearly distinguished depending on the shape of the source trench 33, but in that case, it suffices that the source trench insulating film 39 that contacts a face in a direction crossing the depth direction of the source trench 33 is relatively thick. Moreover, the inside of the source trench insulating film 39 is filled back with a trench buried layer 40. In the present preferred embodiment, the trench buried layer 40 is buried in the source trench 33 such that its upper face becomes substantially flush with the base surface 11B of the n⁻-type epitaxial layer 10.

In the present preferred embodiment, the gate insulating film 17 and the source trench insulating film 39 are constituted of the same material, and the gate electrode 16 and the trench buried layer 40 are constituted of the same material.

For example, as the material for the gate insulating film 17 and the source trench insulating film 39, a film of any of $SiO_2$, AlON, $Al_2O_3$, $SiO_2$/AlON, $SiO_2$/AlON/$SiO_2$, $SiO_2$/SiN, and $SiO_2$/SiN/$SiO_2$ can be used, and more preferably, a film having a $SiO_2$ film containing nitrogen (N) is used. In addition, $SiO_2$/AlON means a laminated film of $SiO_2$ (lower side) and AlON (upper side). Providing a gate insulating film 17 constituted of a high-dielectric-constant (high-k) film of AlON, $Al_2O_3$, or the like allows an improvement in gate withstand voltage, so that device reliability can be improved. Further, providing a gate insulating film 17 constituted of a material having a $SiO_2$ film containing nitrogen (N) also allows an improvement in channel mobility.

As the material for the gate electrode 16 and the trench buried layer 40, polysilicon can be used, and more preferably, n⁺-type polysilicon is used. The n⁺-type polysilicon has a relatively low sheet resistance, which therefore allows increasing transistor switching speed.

In addition, the gate insulating film 17 and the source trench insulating film 39 may be constituted of materials different from each other. The gate electrode 16 and the trench buried layer 40 may also be similarly constituted of materials different from each other.

The contact holes 29 formed in the surface insulating film 26 selectively expose the source trench 33 and the n⁺-type source region 32 over the entire surface of the n⁻-type epitaxial layer 10. In the present preferred embodiment, a source portion 41 is defined in each unit cell 9 by the contact hole 29.

Next, a method for manufacturing the semiconductor device 1 described in FIG. 1 to FIG. 7 will be described.

For manufacturing the semiconductor device 1, an n-type impurity is doped into the surface of a SiC substrate (not shown) while SiC crystals are caused to grow thereon by epitaxy such as a CVD method, an LPE method, or an MBE method. An n⁻-type epitaxial layer 10 is thereby formed on the SiC substrate. A growth surface of the n⁻-type epitaxial layer 10 formed this time corresponds to the base surface 11B. In addition, as the n-type impurity, for example, N (nitride), P (phosphorous), As (arsenic), or the like can be used.

Next, a p-type impurity is selectively ion-implanted from the base surface 11B of the n⁻-type epitaxial layer 10. A p-type well 19 (p-type channel region 35) is thereby formed. In addition, as the p-type impurity, for example, Al (aluminum), B (boron), or the like can be used. Also, simultaneously with formation of the p-type well 19, the rest of the n⁻-type epitaxial layer 10 is formed as an n⁻-type drain region 20.

Next, an n-type impurity is selectively ion-implanted from the base surface 11B of the n⁻-type epitaxial layer 10. An n⁺-type region 21 and an n⁺-type source region 32 are thereby simultaneously formed.

Next, the n⁻-type epitaxial layer 10 is selectively etched by use of a mask having openings in regions where the gate trench 8, the source trenches 33, and the low step portion 12 are to be formed. The n⁻-type epitaxial layer 10 is thereby selectively dry-etched so that a gate trench 8, source trenches 33, and a low step portion 12 are formed, and simultaneously, a lower surface 11L is formed. In conjunction therewith, the n⁻-type epitaxial layer 10 is defined into a plurality of unit cells 9 by the gate trench 8. The unit cells 9 are to have prismatic portions 36 and annular portions 37. As an etching gas, for example, a mixed gas ($SF_6/O_2$ gas) containing $SF_6$ (sulfur hexafluoride) and $O_2$ (oxygen), a mixed gas ($SF_6/O_2$/HBr gas) containing $SF_6$, $O_2$, and HBr (hydrogen bromide), or the like can be used.

In addition, when locating the lower surface 11L of the outer peripheral portion 3 at a position deeper than the depth of the gate trench 8, it suffices to further selectively etch the low step portion 12 after the aforementioned etching.

Next, a p-type impurity is selectively ion-implanted from the semiconductor surface 11 of the n⁻-type epitaxial layer 10. The p-type impurity is implanted, for example, in a direction perpendicular to semiconductor surface 11 of the n⁻-type epitaxial layer 10. A p-type layer 22, a p-type layer 23, a p-type layer 38, and p-type guard rings 25 are thereby simultaneously formed. In addition, these layers 22, 23, 38, and 25 may be formed by separate ion implantation steps.

Next, a p-type impurity is selectively ion-implanted from the semiconductor surface 11 of the n⁻-type epitaxial layer 10. P⁺-type channel contact regions 34 and a p⁺-type well contact region 24 are thereby simultaneously formed.

Next, the n⁻-type epitaxial layer 10 is thermally treated at 1400° C. to 2000° C., for example. The ions of the p-type impurity and n-type impurity implanted into the n⁻-type epitaxial layer 10 are thereby activated.

Next, a gate insulating film 17 and a source trench insulating film 39 are simultaneously formed by, for example, thermal oxidization. In addition, when the gate insulating film 17 and the source trench insulating film 39 are constituted of high-dielectric-constant (high-k) films, it suffices to deposit a film material by a CVD method.

Next, a polysilicon material doped with an n-type impurity is deposited from above the n⁻-type epitaxial layer 10 by, for example, a CVD method. The deposition of the polysilicon material is continued until at least the gate trench 8 and the source trenches 33 have been completely filled back. Thereafter, by the deposited polysilicon material being patterned, the polysilicon material out of the gate trench 8 (inner trench 13 and outer trench 14) and out of the source trenches 33 is removed in the cell portion 2, and in the outer peripheral portion 3, the polysilicon material remains as an overlapping portion 18. At this time, the polysilicon material buried in the low step portion 12 is completely removed. A gate electrode 16 and a trench buried layer 40 are thereby simultaneously formed.

Next, an insulating material such as $SiO_2$ is deposited from above the n⁻-type epitaxial layer 10 by, for example, a CVD method. A surface insulating film 26 is thereby formed.

Next, a part on the cell portion 2 of the surface insulating film 26 is selectively etched. Only said part is thereby thinned, so that an inner part 27 and an outer part 28 of the surface insulating film 26 are formed.

Next, by the surface insulating film 26 being selectively etched, contact holes 29 to 31 are simultaneously formed.

Next, a metal material is deposited from above the n⁻-type epitaxial layer 10 by, for example, a sputtering method. Then, by patterning said material, a source pad 4, a gate pad 5, and gate fingers 6 are simultaneously formed. The semiconductor device 1 shown in FIG. 1 to FIG. 7 is obtained through the above steps.

As above, according to the present semiconductor device 1, the semiconductor surface 11 in which the p-type layer 23 and the p-type guard rings 25 are formed serves as the lower surface 11L at a depth position equivalent to or deeper than the depth of the gate trench 8. The thickness of the n⁻-type epitaxial layer 10 from the bottom portion of the gate trench 8 to a back surface of the n⁻-type epitaxial layer 10 can thereby be made thicker than the thickness from the p-type layer 23 and the p-type guard rings 25 to said back surface. As a result, an electric field imposed on a section between the surface side and back surface side of the n⁻-type epitaxial layer 10 can be made to be stably shared by the p-type layer 23 and the p-type guard rings 25 of the outer peripheral portion 3. Because a stable electric field distribution can accordingly be formed in the n⁻-type epitaxial layer 10 without depending on the depth of the gate trench 8, an electric field concentration to the bottom portion of the gate trench 8 can be satisfactorily relaxed.

Also, as shown in FIG. 2, the gate trench 8 is formed in a region under the gate fingers 6, but the line-shaped contact trenches 15 are only formed in a manner running across the gate fingers 6, and moreover, the terminal portions of the contact trenches 15 are disposed further outside than the gate fingers 6. In other words, because trench corner portions (for example, corners etc., in the crossing portions of the inner trench 13) where an electric field is likely to concentrate when a gate voltage is applied are not disposed under the gate fingers 6, the reliability and resistance of the gate insulating film 17 can be improved.

Also, as shown in FIG. 7, the p-type layer 38 is also formed in a manner extending across the outer peripheral edges of the outer trench 14 via the bottom portion of the outer trench 14. A depletion layer can thereby be generated from a junction (p-n junction) between the p-type layer 38 and the n⁻-type epitaxial layer 10 (n⁻-type drain region 20). Moreover, because the depletion layer keeps equipotential surfaces away from the outer trench 14, electric fields to be imposed on the bottom portion of the outer trench 14 can be relaxed. Breakdown in the bottom portion of the outer trench 14 can accordingly be prevented.

Also, as shown in FIG. 5 and FIG. 6, in a region under the gate fingers 6, the n⁺-type region 21 is formed in the semiconductor surface 11 (base surface 11B) of the n⁻-type epitaxial layer 10. Because an n⁺-type semiconductor region has a higher oxidation rate than that of an n⁻-type semiconductor region, in a region under the gate fingers 6, a thick oxide film can be selectively formed in an upper portion of the gate trench 8 (contact trench 15) when the gate insulating film 17 is formed by thermal oxidization. An electric field to be imposed on an upper edge of the contact trench 15 when a gate voltage is applied can thereby be weakened to prevent a dielectric breakdown of the gate insulating film 17.

Also, as shown in FIG. 3 and FIG. 4, by selectively thinning the surface insulating film 26 (inner part 27) of the cell portion 2, a difference in level (unevenness) between the semiconductor surface 11 (device surface) in the source portions 41 within the contact holes 29 and a surface of the surface insulating film 26 can be reduced. When a source pad 4 is buried in the contact holes 29 to form a source pad 4 on the surface insulating film 26, the flatness of the source pad 4 can thereby be further improved.

On the other hand, the thickness of the surface insulating film 26 (outer part 28) of the outer peripheral portion 3 can be designed separately from the thickness of the inner part 27. Thus, designing with such a thickness so as not to influence the electric field distribution in the outer peripheral portion 3 allows maintaining breakdown characteristics. In other words, according to this arrangement, at the time of an improvement in flatness of the source pad 4, variation in breakdown characteristics and a dielectric breakdown failure due to the variation can be prevented.

Also, as shown in FIG. 7, the trench buried layer 40 is buried in the source trenches 33 via the trench insulating film 39. Therefore, on the surface of the n⁻-type epitaxial layer 10 (device surface), a difference in level (unevenness) between the source portions 41 exposed from the contact holes 29 and other parts can be reduced. The flatness of the source pad 4 on said device surface can thereby be improved. Thus, when, for example, a wire is bonded to the surface of the source pad 4, adhesion between the source pad 4 and the wire can be improved. As a result, the wire can be satisfactorily bonded, so that the wire bonding portion can be improved in reliability. Further, because the source pad 4 is excellent in flatness, destruction of the device by ultrasonic vibration and pressure can be prevented at the time of wire bonding, and a decline in assembling yield can be prevented.

On the other hand, a concentration of equipotential surfaces in a vicinity of the bottom portion of the gate trench 8 can be prevented by the source trench 33, so that a potential gradient in the vicinity of the bottom portion can be made gradual. Therefore, an electric field concentration to the bottom portion of the gate trench 8 can be relaxed. Further, the p⁺-type channel contact region 34 is formed in the top portion of the prismatic portion 36 and is disposed at a position higher than that of the bottom portion of the source trench 33. Thus, even when there is formed a source trench 33, contact with the p-type channel region 35 can be reliably made via the p$^+$-type channel contact region 34. In other words, at the time of an improvement in flatness of the source pad 4, a degradation in device performance such as gate withstand voltage and contact performance with the p-type channel region 35 can be prevented.

Further, in the present preferred embodiment, because the p-type layer 38 is formed around the source trench 33, a depletion layer can be generated from a junction (p-n junction) between the p-type layer 38 and the n$^-$-type drain region 20. Moreover, because the depletion layer keeps equipotential surfaces away from the gate trench 8, electric fields to be imposed on the bottom portion of the gate trench 8 can be further relaxed.

Also, in the present preferred embodiment, because a SiC device in which latch-up is unlikely to occur as compared with a Si device is used, the p$^+$-type channel contact region 34 and the p-type channel region 35 can be provided at positions separated from each other by the source trench 33. That is, in a Si device, because latch-up is relatively likely to occur, it is preferable to dispose the p$^+$-type channel contact region 34 near the p-type channel region 35 to reduce the distance between the regions 34 and 35 as short as possible so as to lower a base resistance between said regions 34 and 35. On the other hand, in such a SiC device as the present semiconductor device 1, because latch-up is relatively unlikely to occur and the importance of considering a base resistance between the regions 34 and 35 is low, the p$^+$-type channel contact region 34 does not need to be disposed near the p-type channel region 35. Thus, the p$^+$-type channel contact region 34 and the p-type channel region 35 can be provided at positions separated from each other by the source trench 33 to electrically connect the regions 34 and 35 by a route through the bottom portion of the source trench 33.

Also, because the source trench insulating film 39 is disposed outside of the trench buried layer 40, flow of an off-leakage current between the n$^-$-type epitaxial layer 10 and the source pad 4 can be prevented. Specifically, the p-type layer 38 is, at a side portion of the source trench 33, thinner than a part at the bottom portion of the source trench 33 because ions are unlikely to enter a portion lateral to the source trench 33 at the time of ion implantation. Therefore, when a high voltage is applied at OFF-time, an off-leakage current may flow passing through the thin part of the p-type layer 38. Therefore, forming a source trench insulating film 39 allows reliably interrupting a leakage current by the source trench insulating film 39 even if an off-leakage current passes through the p-type layer 38.

Also, if the trench buried layer 40 buried in the source trench 33 is polysilicon, when forming contact holes 29 in the surface insulating film 26 made of SiO$_2$, the trench buried layer 40 (polysilicon layer) can be used as an etching stopper. Therefore, control of the step of said contact etching can be simplified.

Also, because the source trenches 33 are formed simultaneously with the gate trench 8, the source trenches 33 can be simply formed free from misalignment without increasing the manufacturing process. Further, if the source trenches 33 and the gate trench 8 are the same width, the etching rate for the source trenches 33 can be made the same as that for the gate trench 8, so that etching for forming the source trenches 33 can be stably controlled.

Next, modifications of the cell portion 2 will be described with reference to FIG. 8 to FIG. 12.

FIG. 8 to FIG. 12 are views showing first to fifth modifications of the cell portion 2. In FIG. 8 to FIG. 12, parts corresponding to the respective portions shown in FIG. 7 described above are shown with the same reference signs.

Figure 8:
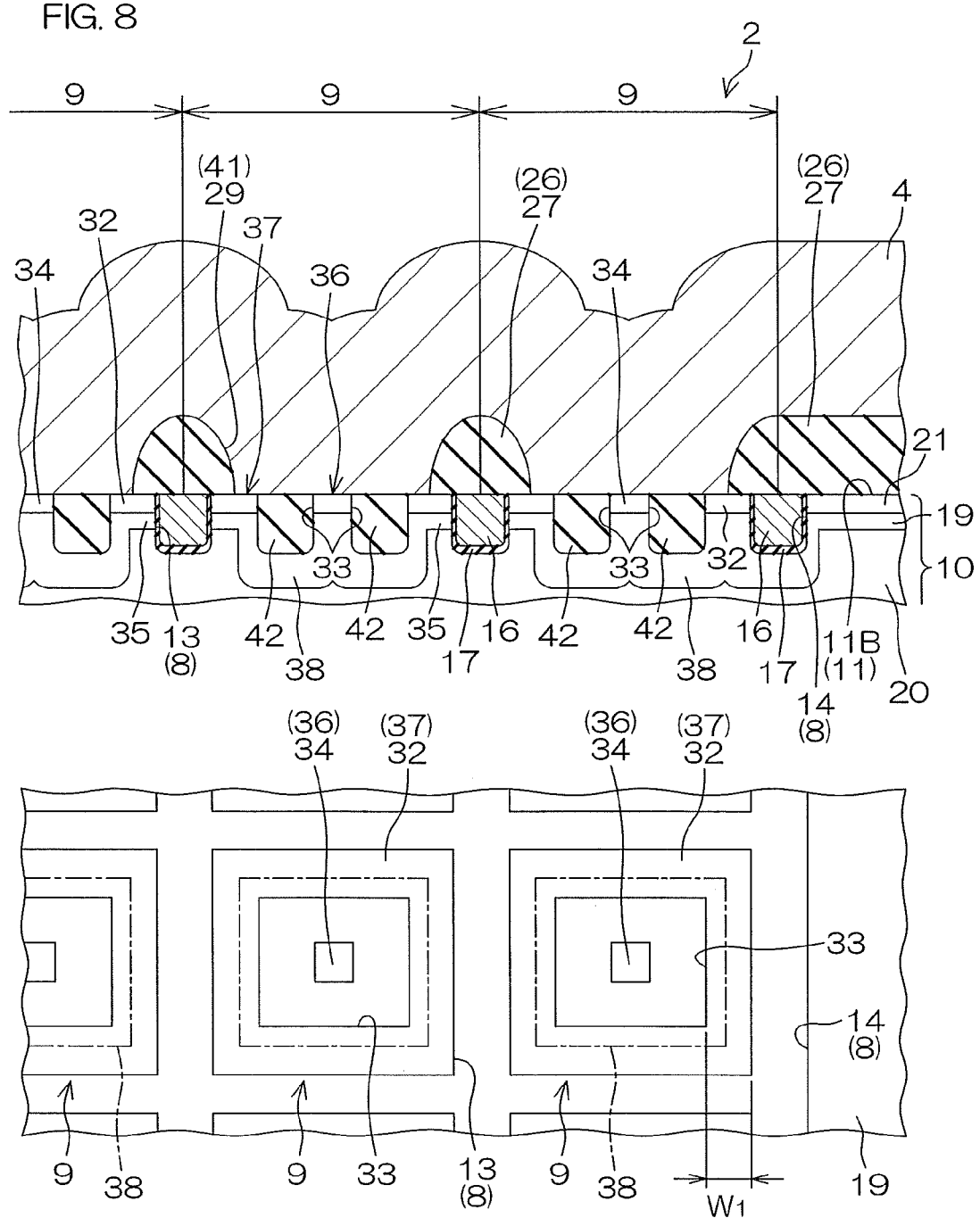
FIG. 8 is a view showing a first modification of the cell portion.

In the form of FIG. 7, the trench buried portion buried in the source trench 33 consists of the source trench insulating film 39 and the trench buried layer 40 (polysilicon layer), but as shown in FIG. 8, it may consist only of an insulating layer 42 that fills back the source trenches 33.

As the material for the insulating layer 42, SiO$_2$ can be used, and more preferably, SiO$_2$ containing phosphorus (P) or boron (B) is used. As such SiO$_2$, for example, PSG (phosphorus silicate glass) or PBSG (phosphorus boron silicate glass) can be used.

A process for manufacturing the semiconductor device of the form shown in FIG. 8 is substantially the same as the steps described in the foregoing. However, after a gate electrode 16 and a trench buried layer 40 are formed, the trench buried layer 40 is selectively etched to be removed, so that the source trenches 33 are made hollow. Then, a surface insulating film 26 is formed on the n$^-$-type epitaxial layer 10 to thereby fill back the source trenches 33 by use of a part of the surface insulating film 26. The source trench insulating film 39 and the surface insulating film 26 are thereby integrated inside the source trenches 33, so that an insulating layer 42 is formed.

According to this arrangement, because the source trenches 33 are filled with the insulating layer 42, flow of an off-leakage current between the n$^-$-type epitaxial layer 10 and the source pad 4 can be effectively prevented.

Also, if the insulating layer 42 is SiO$_2$ containing phosphorous or boron, because the melting point of SiO$_2$ falls, the process for burying the insulating layer 42 can be simplified.

Figure 9:
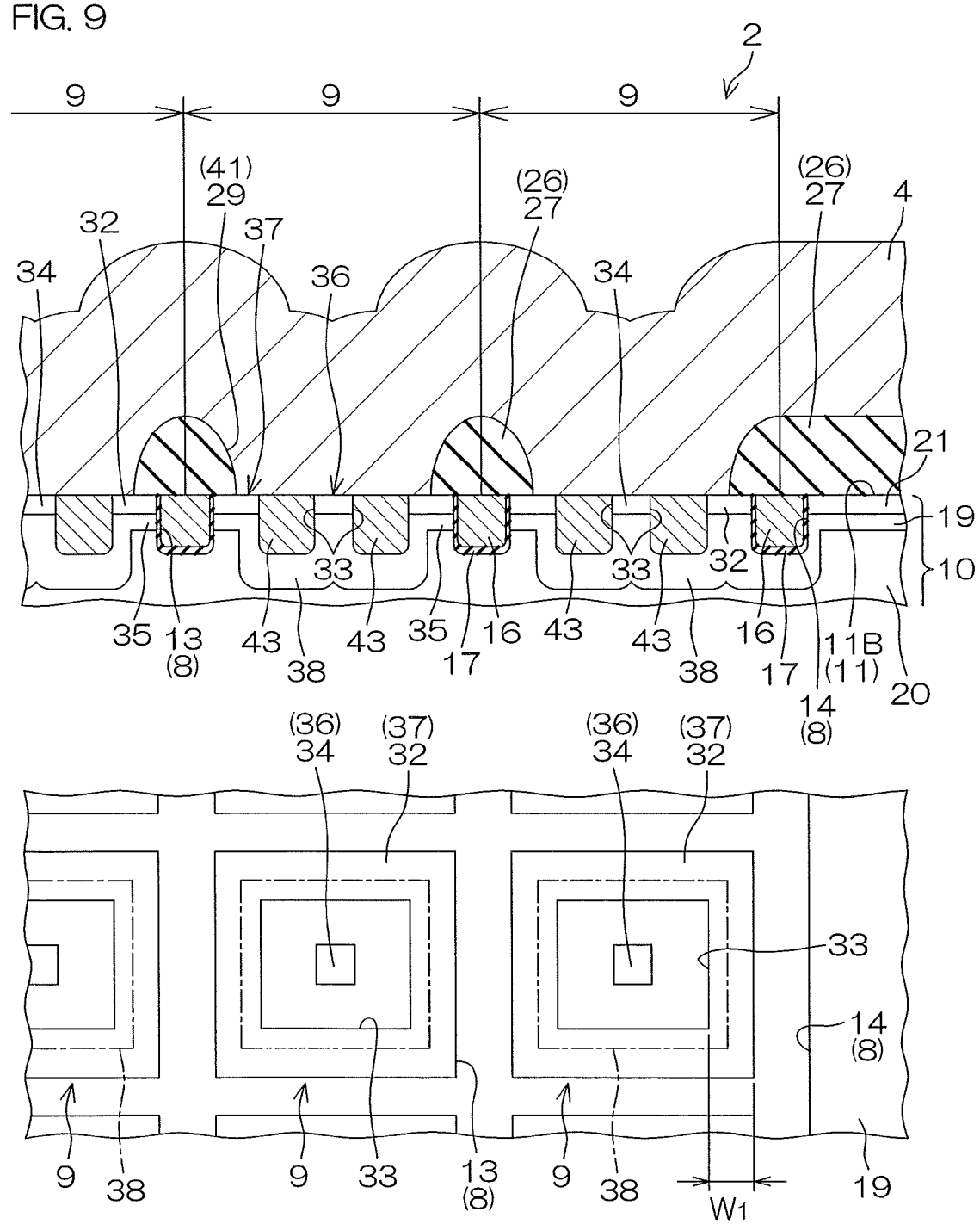
FIG. 9 is a view showing a second modification of the cell portion.

Also, as shown in FIG. 9, the trench filling portion buried in the source trench 33 may consist only of a polysilicon layer 43 that fills back the source trenches 33. As the material for the polysilicon layer 43, p$^+$-type polysilicon is preferably used.

A process for manufacturing the semiconductor device of the form shown in FIG. 9 is substantially the same as the steps described in the foregoing. However, after a gate insulating film 17 and a source trench insulating film 39 are formed, the source trench insulating film 39 is selectively etched to be removed, so that the source trenches 33 are made hollow. Then, by polysilicon being deposited from above the n$^-$-type epitaxial layer 10, the source trenches 33 are filled back with that polysilicon. A gate electrode 16 and a polysilicon layer 43 are thereby simultaneously formed.

According to this arrangement, because the polysilicon layer 43 is buried in the source trenches 33, when forming contact holes 29 in the surface insulating film 26 made of SiO$_2$, the polysilicon layer 43 can be used as an etching stopper. Therefore, control of the step of said contact etching can be simplified.

Also, if the polysilicon layer 43 is p$^+$-type polysilicon, the p$^+$-type channel contact region 34 and the p-type channel region 35 can be electrically connected by use of the polysilicon layer 43. Because the length of a current path between the regions 34 and 35 can thereby be reduced, a base resistance therebetween can be reduced. As a result, latch-up can be satisfactorily prevented. Further, because the p$^+$-type channel contact region 34 is in contact with the polysilicon layer 43 at a side face of the source trench 33, a contact resistance therebetween can also be reduced. The reduction in contact resistance also contributes to a reduction in the base resistance between the regions 34 and 35.

Figure 10:
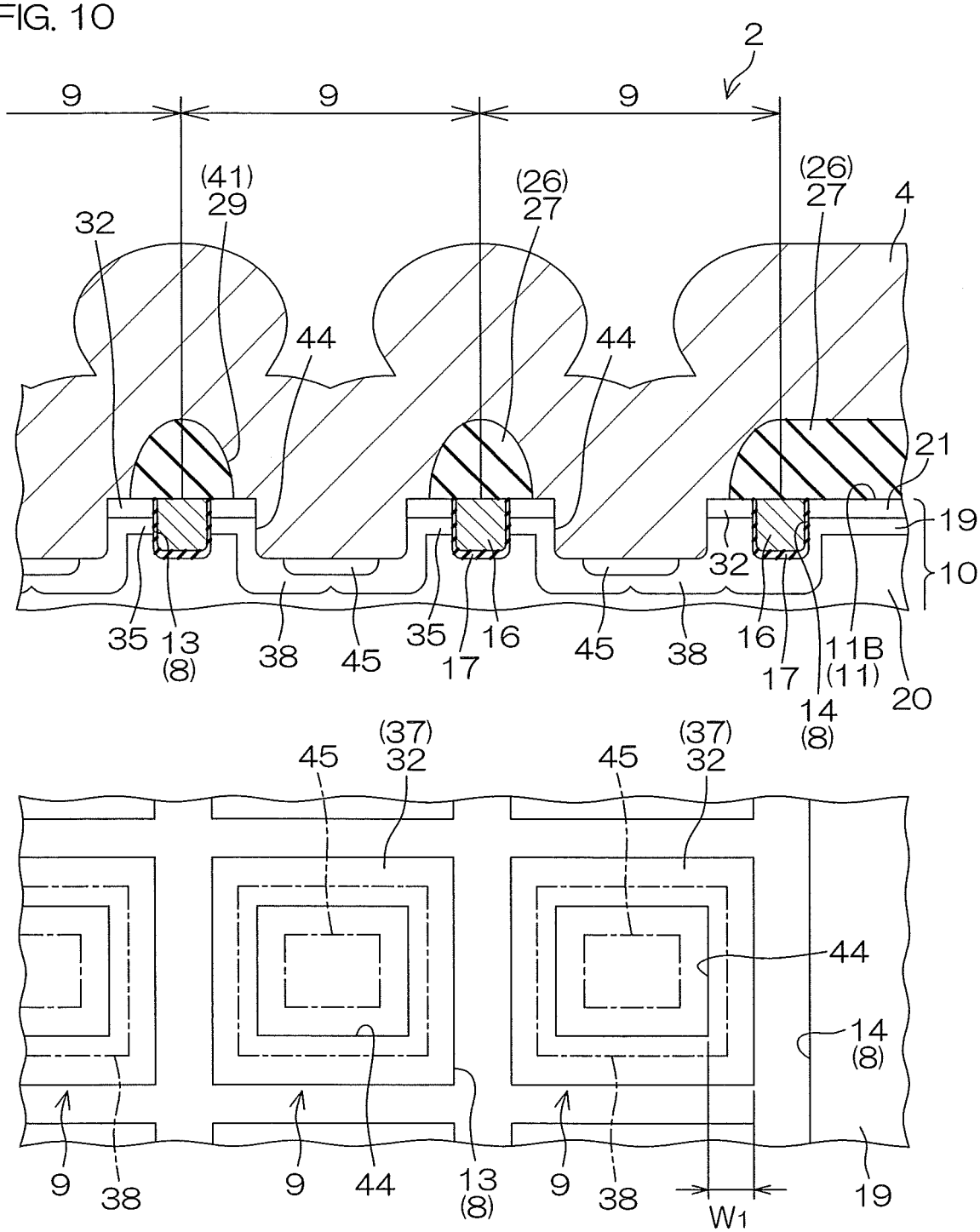
FIG. 10 is a view showing a third modification of the cell portion.

Also, in the form of FIG. 7, the source trench 33 is formed in an annular shape in a region surrounded by the annular n+-type source region 32, but as shown in FIG. 10, a source trench 44 in a recessed shape showing a quadrangular shape in a plan view may be formed in a region surrounded by the n+-type source region 32. In this case, a p+-type channel contact region 45 may be formed in a surface portion of the p-type layer 38 at a bottom portion of the source trench 44.

Figure 11:
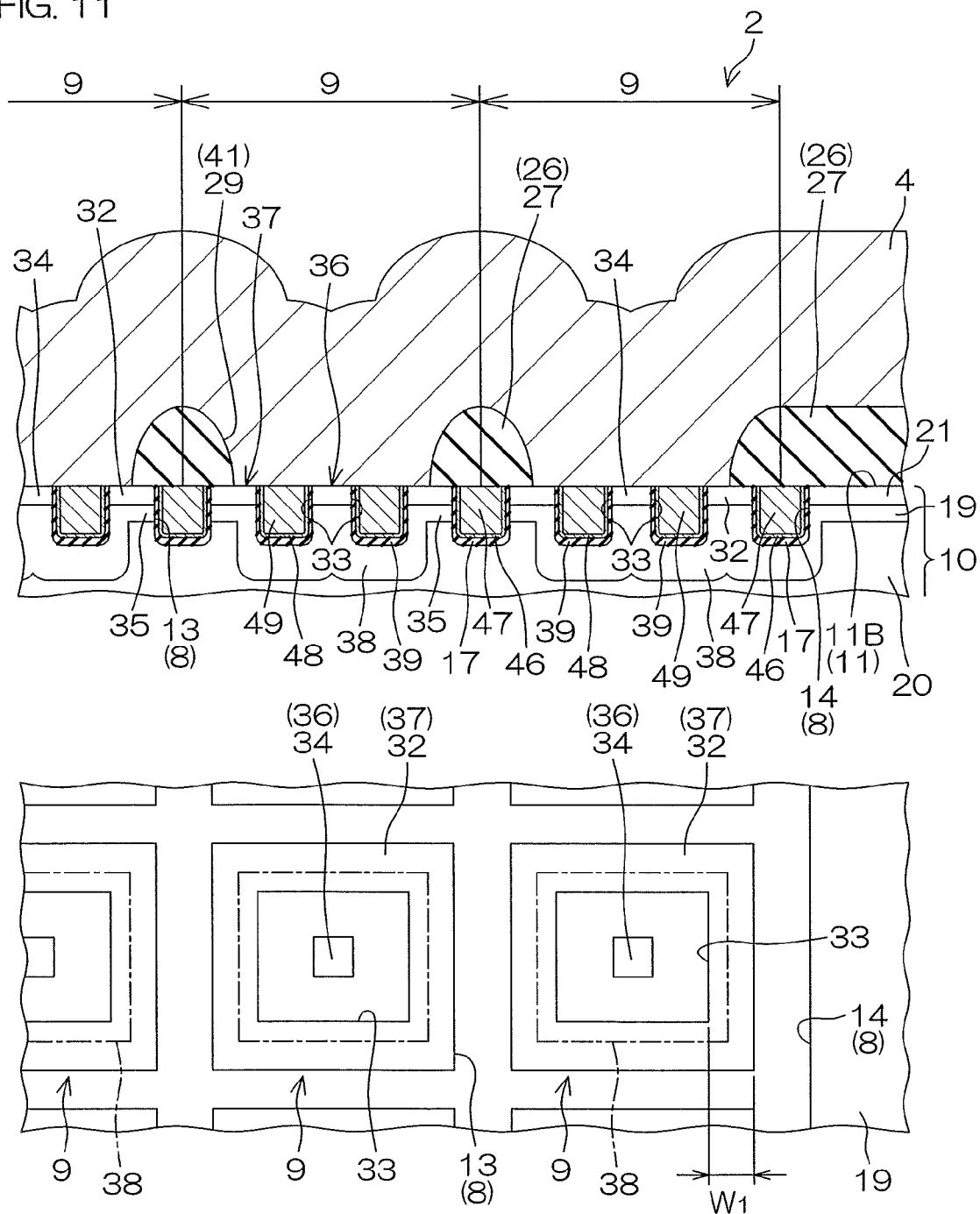
FIG. 11 is a view showing a fourth modification of the cell portion.

Also, in the form of FIG. 7, the gate electrode 16 is a layer made only of polysilicon that fills back the inside of the gate insulating film 17, but as shown in FIG. 11, it may consist of a base film 46 made of polysilicon formed, on the gate insulating film 17, such that its one surface and the other surface extend along the inner surface of the gate trench 8 and a buried metal 47 containing at least one of Mo, W, Al, Pt, Ni, and Ti buried inside of the base film 46. In this case, the trench buried portion within the source trench 33 may also similarly consist of a base film 48 made of polysilicon formed, on the source trench insulating film 39, such that its one surface and the other surface extend along the inner surface of the source trench 33 and a buried metal 49 made of the same material as that for the buried metal 47 buried inside of the base film 48.

According to this arrangement, a metal gate using the buried metal 47 can make gate resistance relatively low as compared with that of a polysilicon gate, which therefore allows increasing transistor switching speed.

Figure 12:
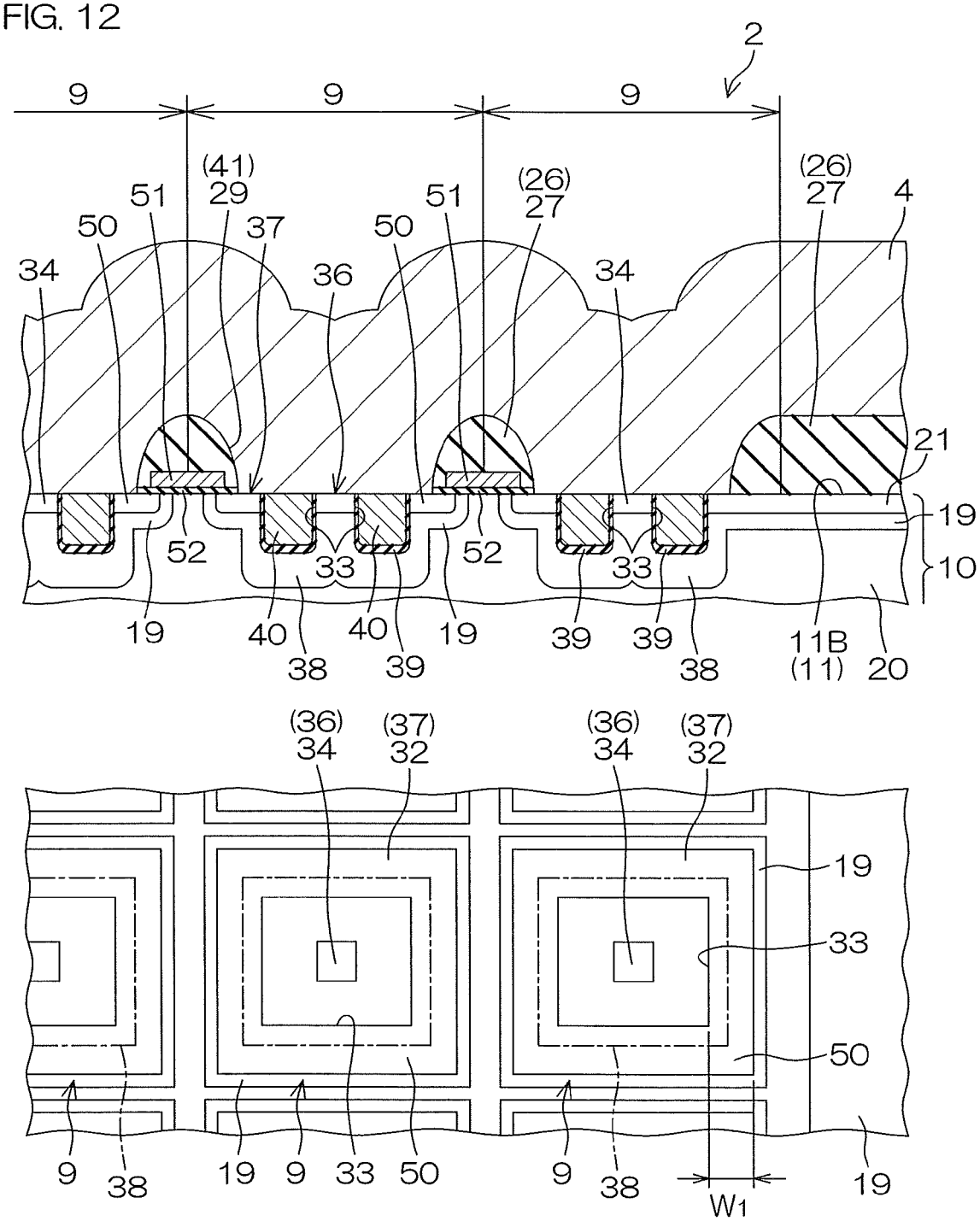
FIG. 12 is a view showing a fifth modification of the cell portion.

Also, a trench-gate type structured MISFET is formed in the cell portion 2 of FIG. 7, but as shown in FIG. 12, a planar type structured MISFET may be formed in the cell portion 2.

That is, in the form shown in FIG. 12, p-type wells 19 are arrayed in a matrix shape (in an array) in the cell portion 2 in a manner corresponding to the respective unit cells 9. In a surface portion of each p-type well 19, an annular n+-type source region 50 is formed in a manner exposed on the base surface 11B. Moreover, a gate electrode 51 is disposed via a gate insulating film 52 in a manner opposed to a region between an outer peripheral edge of each p-type well 19 and an outer peripheral edge of the n+-type source region 50. The surface insulating film 26 covers the gate electrode 51.

Second Preferred Embodiment

Figure 13:
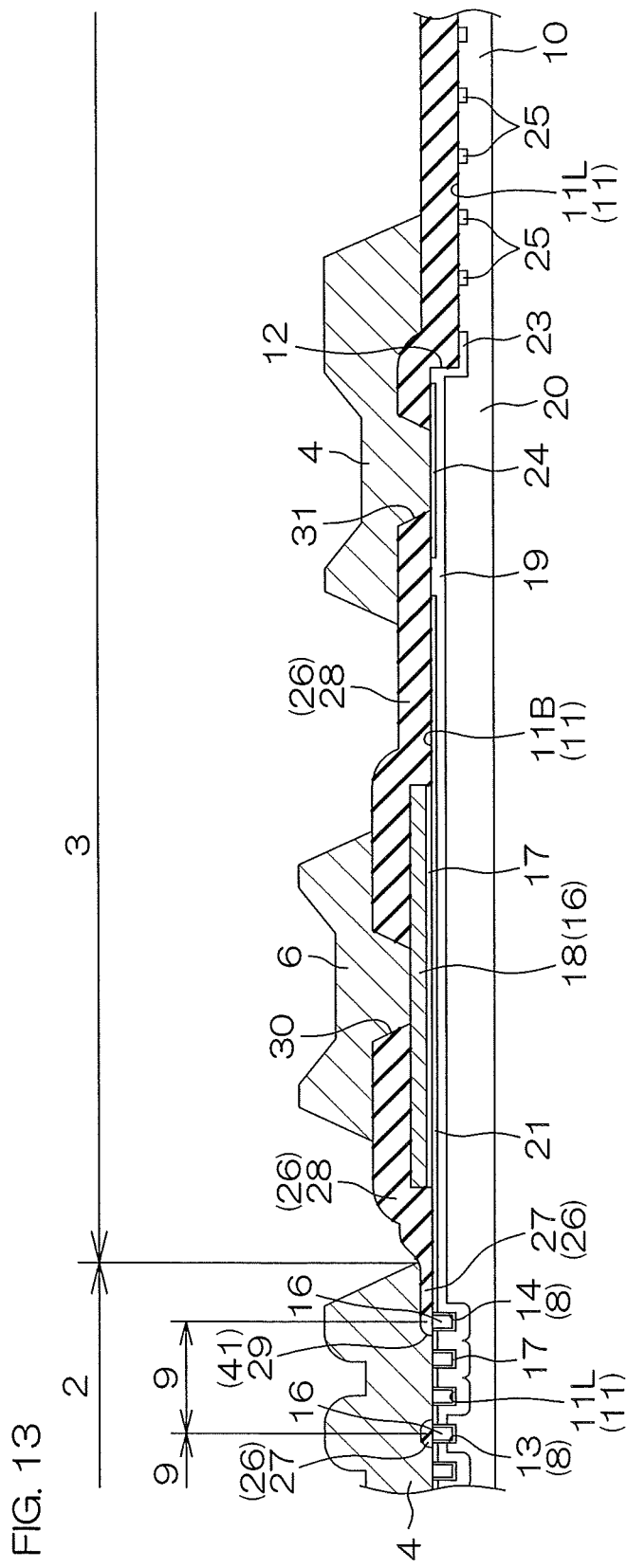
FIG. 13 is a schematic sectional view of a semiconductor device according to a second preferred embodiment of the present invention.
Figure 14:
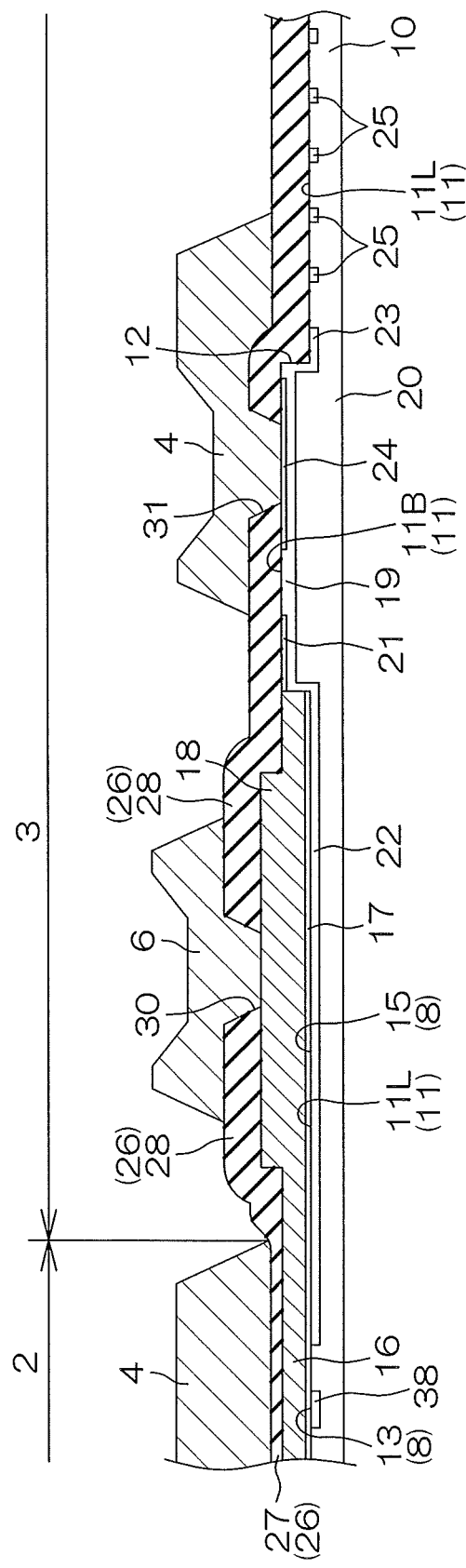
FIG. 14 is a schematic sectional view of the semiconductor device according to the second preferred embodiment of the present invention.

FIG. 13 and FIG. 14 are schematic sectional views of a semiconductor device according to a second preferred embodiment of the present invention, and show sectional structures corresponding to FIG. 3 and FIG. 4, respectively. In FIG. 13 and FIG. 14, parts corresponding to the respective portions shown in FIG. 3 and FIG. 4 described above are shown with the same reference signs.

In the first preferred embodiment described above, a boundary between the base surface 11B and the lower surface 11L due to the low step portion 12 is set further inside than a contact position of the source pad 4 with respect to the p-type well 19 extending across the cell portion 2 and the outer peripheral portion 3, but as shown in FIG. 13 and FIG. 14, it may be set outside. In this case, the p+-type well contact region 24 is formed at a position spaced apart to the outside with respect to the n+-type region 21 in an inner region of the p-type well 19.

According to this arrangement, both the p+-type channel contact regions 34 and the p+-type well contact region 24 can be formed in the base surface 11B, which can therefore make mask alignment easy at the time of ion injection when these regions 24 and 34 are formed. Of course, the same effects as those of the first preferred embodiment can also be realized.

Third Preferred Embodiment

Figure 15:
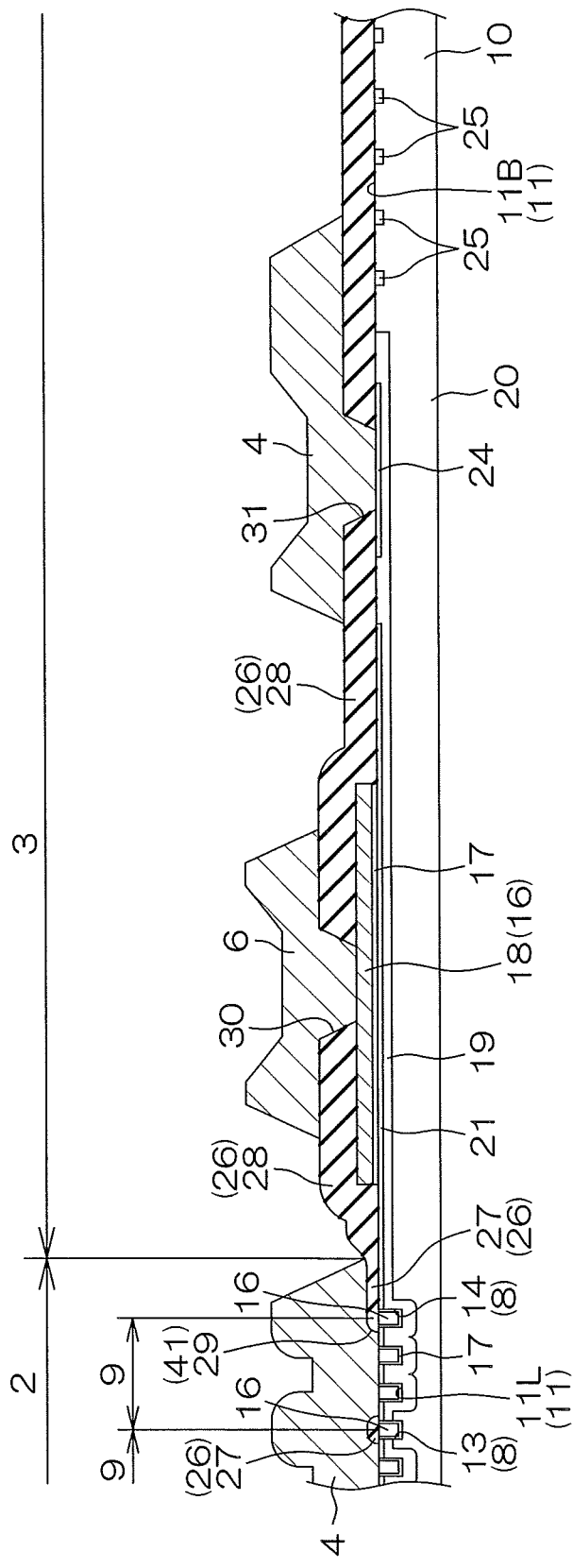
FIG. 15 is a schematic sectional view of a semiconductor device according to a third preferred embodiment of the present invention.
Figure 16:
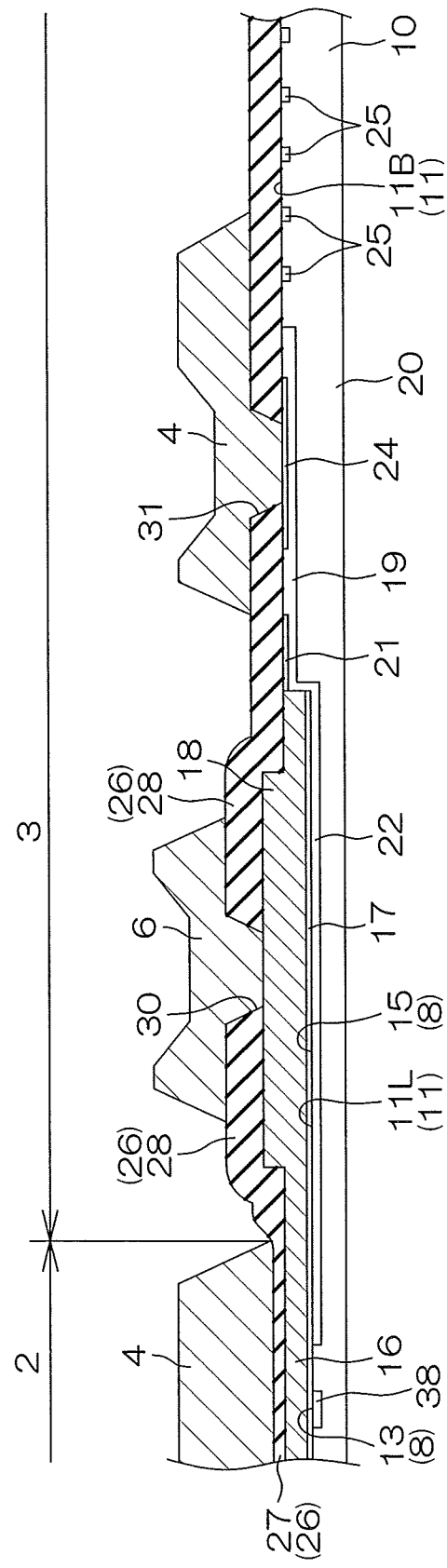
FIG. 16 is a schematic sectional view of the semiconductor device according to the third preferred embodiment of the present invention.

FIG. 15 and FIG. 16 are schematic sectional views of a semiconductor device according to a third preferred embodiment of the present invention, and show sectional structures corresponding to FIG. 3 and FIG. 4, respectively. In FIG. 15 and FIG. 16, parts corresponding to the respective portions shown in FIG. 3 and FIG. 4 described above are shown with the same reference signs.

In the first preferred embodiment described above, the low step portion 12 is formed in the outer peripheral portion 3, but in the present third preferred embodiment, no low step portion 12 is formed in the outer peripheral portion 3, and the outer peripheral portion 3 has a semiconductor surface 11 at the same height position as that of the base surface 11B of the cell portion 2.

According to this arrangement, both the p+-type channel contact regions 34 and the p+-type well contact region 24 can be formed in the base surface 11B, which can therefore make mask alignment easy at the time of ion injection when these regions 24 and 34 are formed. Of course, the same effects as those of the first preferred embodiment can also be realized.

First Reference Embodiment

Figure 17:
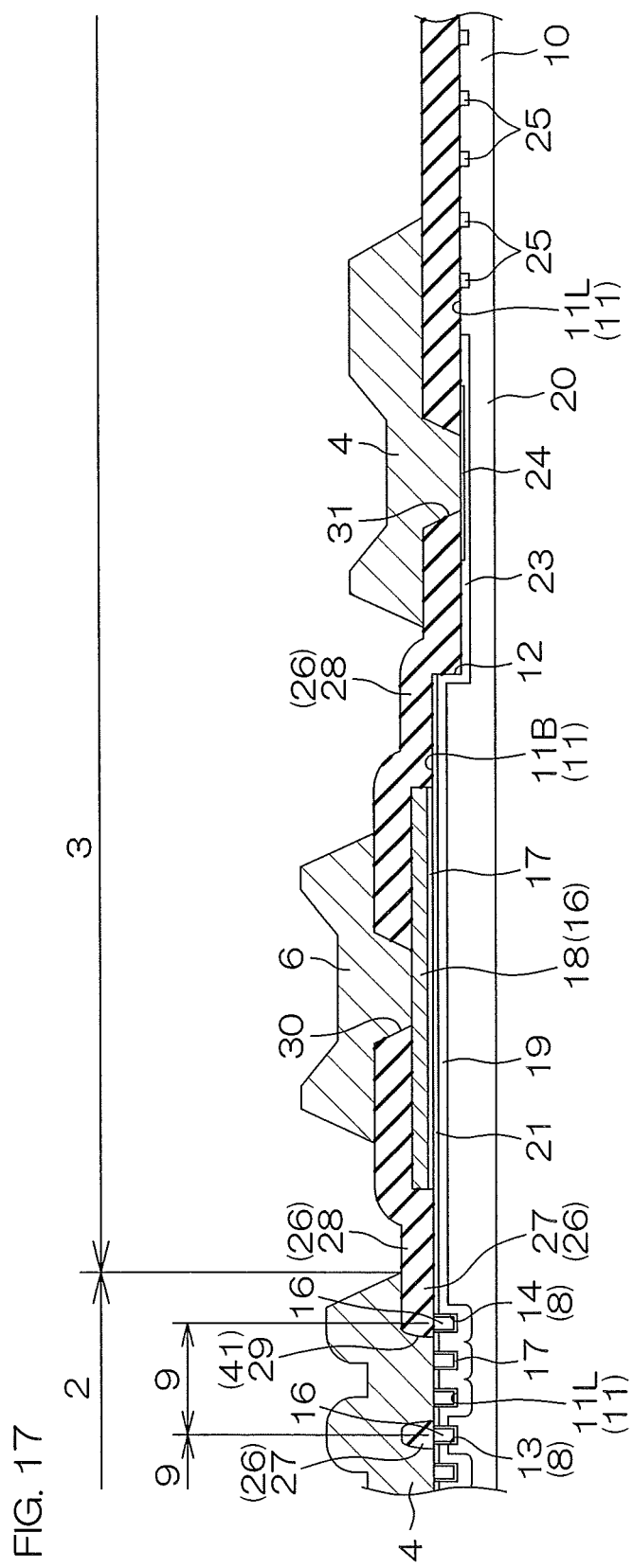
FIG. 17 is a schematic sectional view of a semiconductor device according to a first reference embodiment.
Figure 18:
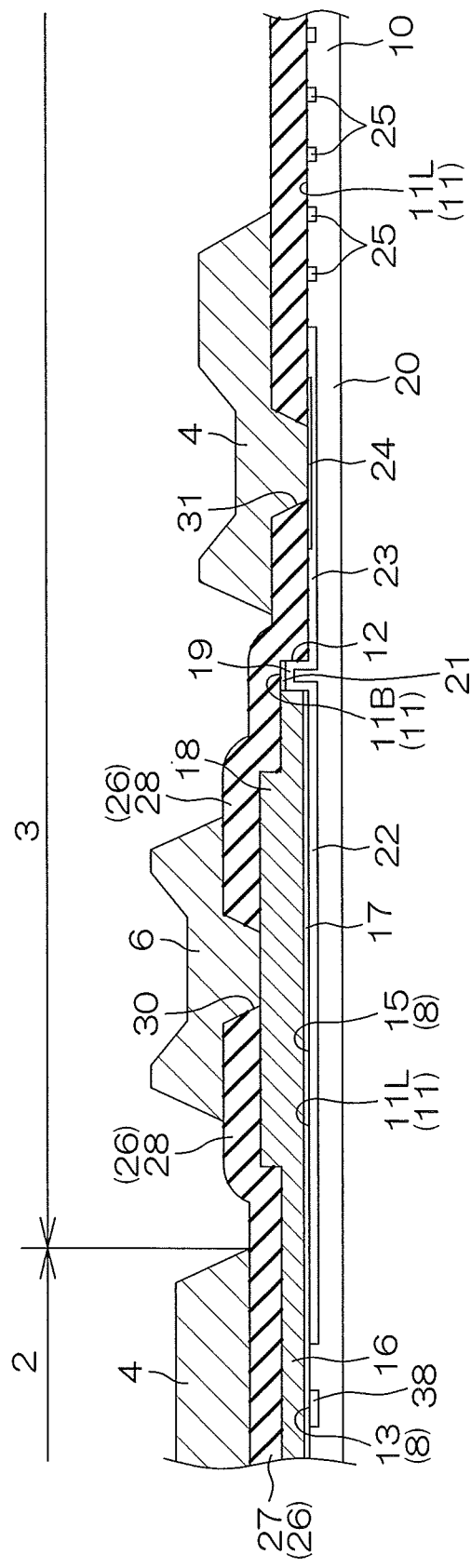
FIG. 18 is a schematic sectional view of the semiconductor device according to the first reference embodiment.

FIG. 17 and FIG. 18 are schematic sectional views of a semiconductor device according to a first reference embodiment of the present invention, and show sectional structures corresponding to FIG. 3 and FIG. 4, respectively. In FIG. 17 and FIG. 18, parts corresponding to the respective portions shown in FIG. 3 and FIG. 4 described above are shown with the same reference signs.

In the first preferred embodiment described above, the surface insulating film 26 is formed such that the inner part 27 on the cell portion 2 becomes thinner than the outer part 28 on the outer peripheral portion 3, but as shown in FIG. 17 and FIG. 18, it may be formed such that the inner part 27 on the cell portion 2 has the same thickness as that of the outer part 28 on the outer peripheral portion 3. The film thickness may be, for example, about 5500 Å to 20000 Å.

Second Reference Embodiment

Figure 19:
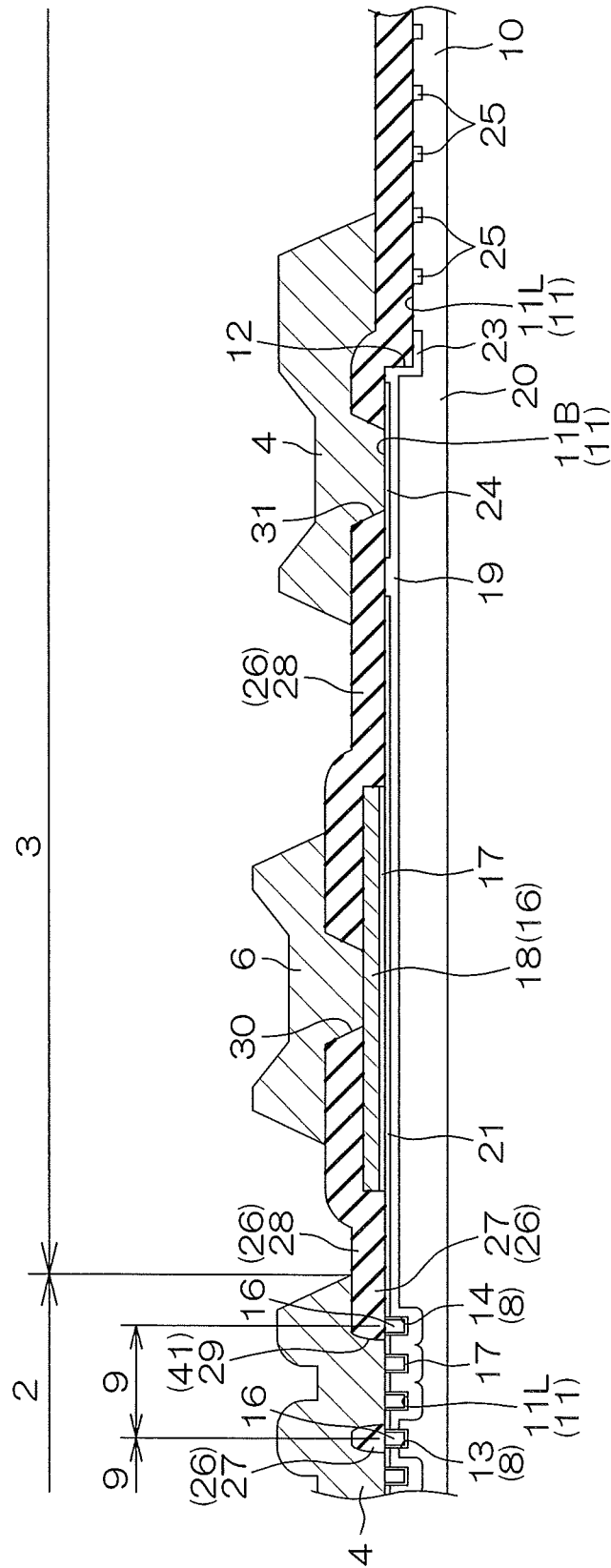
FIG. 19 is a schematic sectional view of a semiconductor device according to a second reference embodiment.
Figure 20:
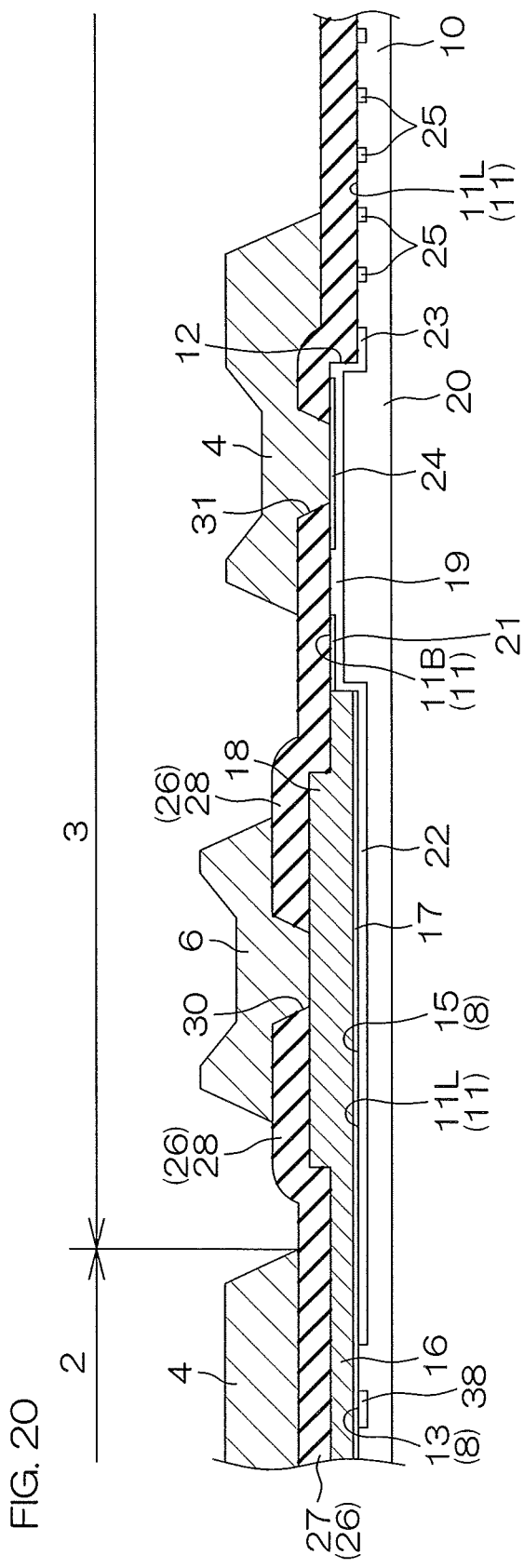
FIG. 20 is a schematic sectional view of the semiconductor device according to the second reference embodiment.

FIG. 19 and FIG. 20 are schematic sectional views of a semiconductor device according to a second reference embodiment of the present invention, and show sectional structures corresponding to FIG. 3 and FIG. 4, respectively. In FIG. 19 and FIG. 20, parts corresponding to the respective portions shown in FIG. 3 and FIG. 4 described above are shown with the same reference signs.

The structure in FIG. 19 and FIG. 20 is an example for which the arrangement of the surface insulating film 26 having a uniform thickness of the first reference embodiment described above is combined with the structure of the second preferred embodiment.

Fourth Preferred Embodiment

Figure 21:
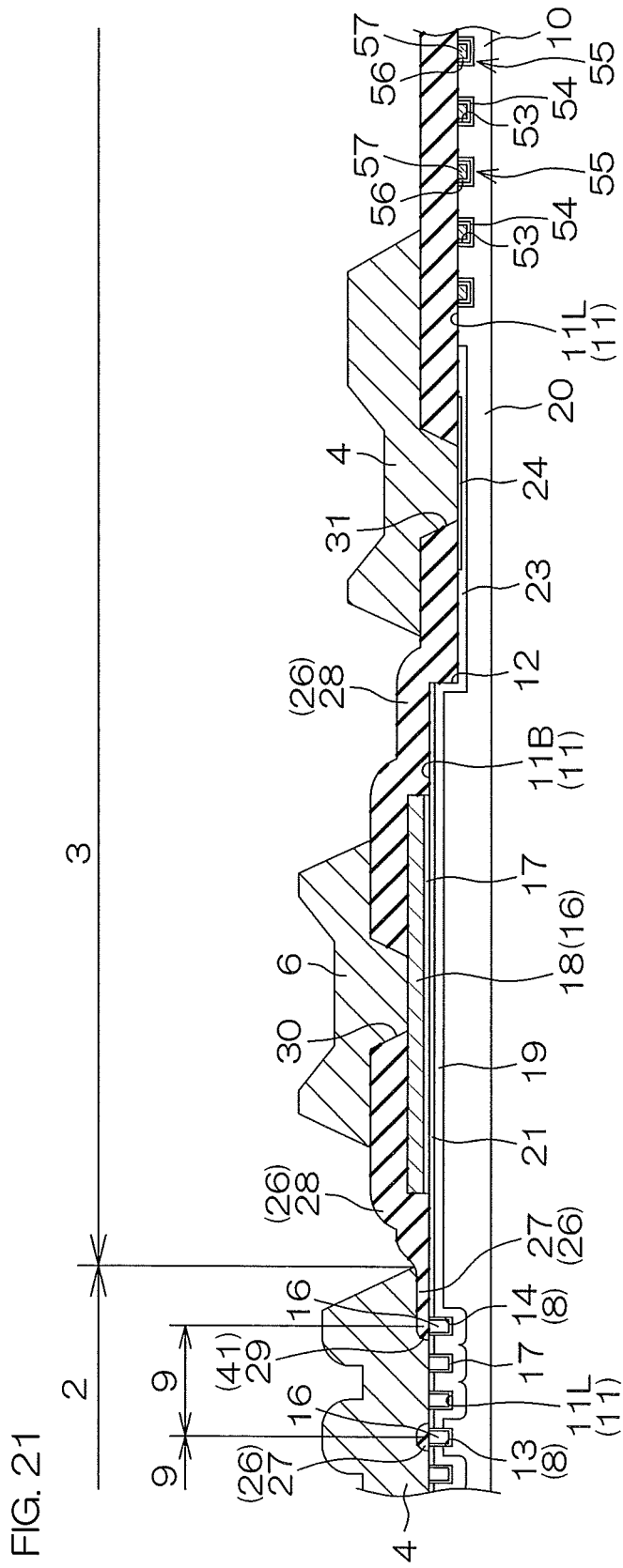
FIG. 21 is a schematic sectional view of a semiconductor device according to a fourth preferred embodiment of the present invention.

FIG. 21 is a schematic sectional view of a semiconductor device according to a fourth preferred embodiment of the present invention, and shows a sectional structure corresponding to FIG. 3. In FIG. 21, parts corresponding to the respective portions shown in FIG. 3 described above are shown with the same reference signs.

In the first preferred embodiment described above, the voltage resistant structure of the outer peripheral portion 3 consists only of p-type semiconductor regions, like the p-type layer 23 and the p-type guard rings 25, but as shown in FIG. 21, it may be arranged to include a trench formed in the lower surface 11L and a p-type semiconductor region formed at a bottom portion of the trench. In this case, the trench may have a conductive material buried therein via an insulating film. In the present preferred embodiment, guard rings 55 are formed each including a trench 53 formed in the lower surface 11L and having an annular shape to surround the cell portion 2 and a p-type layer 54 which is formed at bottom and side portions of the trench 53 and an inner region of which is in contact with the trench 53. In the trenches 53, a polysilicon layer 57 is buried via a trench insulating film 56.

By this arrangement as well, the same effects as those of the first preferred embodiment can be realized.

Although preferred embodiments of the present invention have been described above, the present invention can be embodied in other forms.

For example, an arrangement may be adopted in which the conductivity type of each semiconductor part of the semiconductor device 1 is inverted. For example, in the semiconductor device 1, the p-type parts may be n-type and the n-type parts may be p-type.

Also, in the semiconductor device 1, the layer that constitutes a semiconductor layer is not limited to an n$^-$-type epitaxial layer made of SiC, and may be a layer or the like made of GaN, diamond, or Si.

Also, each unit cell 9 is not limited to a square shape in a plan view (quadrangular shape), but may have another shape such as, for example, a triangular shape in a plan view, a pentagonal shape in a plan view, or a hexagonal shape in a plan view.

The semiconductor device of the present invention can be incorporated in, for example, a power module for use in an inverter circuit that constitutes a drive circuit for driving an electric motor available as a power source for an electric vehicle (including a hybrid vehicle), an electric train, an industrial robot, and the like. Additionally, the semiconductor device of the present invention can also be incorporated in a power module for use in an inverter circuit that converts electric power generated by a solar cell, a wind power generator, and other power generators (particularly, private electric generators) so as to be matched with electric power from commercial power sources.

Also, the features grasped from the disclosures of the preferred embodiments described above may be combined with each other even among different preferred embodiments. Also, the components presented in the respective preferred embodiments may be combined within the scope of the present invention.

The preferred embodiments of the present invention are merely specific examples used to clarify the technical content of the present invention, and the present invention should not be interpreted as being limited to these specific examples, and the spirit and scope of the present invention shall be limited solely by the accompanying claims.

The present application corresponds to Japanese Patent Application No. 2013-43407 filed on Mar. 5, 2013 in the Japan Patent Office, and the entire disclosure of this application is incorporated herein by reference.

REFERENCE SIGNS LIST

1 Semiconductor device
2 Cell portion
3 Outer peripheral portion
4 Source pad
5 Gate pad
6 Gate finger
7 Removal region
8 Gate trench
9 Unit cell
10 N$^-$-type epitaxial layer
11 Semiconductor surface
11B Base surface
11L Lower surface
12 Low step portion
13 Inner trench
14 Outer trench
15 Contact trench
16 Gate electrode
17 Gate insulating film
18 Overlapping portion
19 P-type well
20 N$^-$-type drain region
21 N$^+$-type region
22 P-type layer
23 P-type layer
24 P$^+$-type well contact region
25 P-type guard ring
26 Surface insulating film
27 Inner part
28 Outer part
29 Contact hole
30 Contact hole
31 Contact hole
32 N$^+$-type source region
33 Source trench
34 P$^+$-type channel contact region
35 P-type channel region
36 Prismatic portion
37 Annular portion
38 P-type layer
39 Source trench insulating film
40 Trench buried layer
41 Source portion
42 Insulating layer
43 Polysilicon layer
44 Source trench
45 P$^+$-type channel contact region
46 Base film
47 Buried metal
48 Base film
49 Buried metal
50 N$^+$-type source region
51 Gate electrode
52 Gate insulating film
53 Trench
54 P-type layer
55 Guard ring
56 Trench insulating film
57 Polysilicon layer

The invention claimed is:

1. A semiconductor device comprising:
    a semiconductor layer of a first conductivity type having a cell portion and an outer peripheral portion disposed around the cell portion;
    a surface insulating film disposed in a manner extending across the cell portion and the outer peripheral portion, and in the cell portion, formed to be thinner than a part in the outer peripheral portion;
    a gate trench formed at a surface side of the cell portion;

a gate electrode buried in the gate trench via a gate insulating film; and a gate finger to make contact with the gate electrode, the gate finger disposed in at least the outer peripheral portion, wherein the gate trench includes a line-shaped trench that reaches the outer peripheral portion and runs across the gate finger under the gate finger.

2. The semiconductor device according to claim 1, wherein the outer peripheral portion has a semiconductor surface disposed at a depth position equal to or deeper than a depth of the gate trench, and the semiconductor device further comprises a voltage resistant structure having a semiconductor region of a second conductivity type formed in the semiconductor surface of the outer peripheral portion.

3. The semiconductor device according to claim 1, wherein the gate trench includes an inner trench at a portion lateral to which the channel is formed at ON-time, and an outer trench constituted of an extension portion of the inner trench, disposed outside with respect to the inner trench, and the semiconductor device further includes a second conductivity-type layer formed at side and bottom portions of the outer trench.

4. The semiconductor device according to claim 1, wherein the gate trench is selectively formed in a region under the gate finger, and the semiconductor device further comprises a high-concentration layer of a first conductivity type formed in a semiconductor surface of the semiconductor layer where the gate trench is not formed in the region under the gate finger, containing an impurity at a higher concentration than that of the semiconductor layer.

5. The semiconductor device according to claim 1, wherein the cell portion includes:

a source region of a first conductivity type disposed in a manner exposed on a surface of the semiconductor layer;

a channel region of a second conductivity type which is disposed in a manner contacting the source region and in which the channel is formed at ON-time;

a drain region of a first conductivity type disposed in a manner contacting the channel region;

a second trench selectively formed in a source portion defined in a manner including the source region in the surface of the semiconductor layer; and a channel contact region of a second conductivity type selectively disposed at a bottom portion of the second trench, electrically connected with the channel region.

6. The semiconductor device according to claim 1, wherein the cell portion includes:

a source region of a first conductivity type disposed in a manner exposed on a surface of the semiconductor layer;

a channel region of a second conductivity type which is disposed in a manner contacting the source region and in which the channel is formed at ON-time;

a drain region of a first conductivity type disposed in a manner contacting the channel region;

a second trench selectively formed in a source portion defined in a manner including the source region in the surface of the semiconductor layer;

a trench buried portion buried in the second trench; and a channel contact region of a second conductivity type selectively disposed at a position higher than that of a bottom portion of the second trench in the source region, electrically connected with the channel region.

7. The semiconductor device according to claim 6, wherein the trench buried portion consists of an insulating film formed on an inner surface of the second trench and a polysilicon layer buried inside of the insulating film.

8. The semiconductor device according to claim 7, wherein the insulating film is made of any of $SiO_2$, AlON, $Al_2O_3$, $SiO_2$/AlON, $SiO_2$/AlON/$SiO_2$, $SiO_2$/SiN, and $SiO_2$/SiN/$SiO_2$.

9. The semiconductor device according to claim 7, wherein the insulating film has a $SiO_2$ film containing nitrogen (N).

10. The semiconductor device according to claim 7, wherein the insulating film is, at the bottom portion of the second trench, formed to be thicker than a part at a side portion of the second trench.

11. The semiconductor device according to claim 7, wherein the polysilicon layer is made of $n^+$-type polysilicon.

12. The semiconductor device according to claim 6, wherein the trench buried portion consists of an insulating layer that fills back the second trench.

13. The semiconductor device according to claim 12, wherein the insulating layer is made of $SiO_2$.

14. The semiconductor device according to claim 13, wherein the insulating layer is made of $SiO_2$ containing phosphorus (P) or boron (B).

15. The semiconductor device according to claim 6, wherein the trench buried portion consists of a polysilicon layer that fills back the second trench.

16. The semiconductor device according to claim 15, wherein the polysilicon layer is made of $p^+$-type polysilicon.

17. The semiconductor device according to claim 5, further comprising a second conductivity-type layer formed at the bottom portion and a side portion of the second trench in a manner continuing from the channel region and the channel contact region.

18. The semiconductor device according to claim 1, wherein the gate electrode includes a base film made of polysilicon formed on an inner surface of the gate trench, and a buried metal containing at least one of Mo, W, Al, Pt, Ni, and Ti buried inside of the base film.

19. The semiconductor device according to claim 1, wherein the semiconductor device further comprises a surface metal layer made of a metal containing copper (Cu) disposed at a surface side of the semiconductor layer.

20. The semiconductor device according to claim 19, wherein the surface metal layer contains an Al—Cu-based alloy.

21. The semiconductor device according to claim 1, wherein in the cell portion, unit cells defined in a grid shape by the gate trench are formed in plural numbers.

22. The semiconductor device according to claim 1, wherein in the cell portion, unit cells defined in a striped shape by the gate trench are formed in plural numbers.

23. The semiconductor device according to claim 1, wherein the semiconductor layer is made of SiC, GaN, or diamond.

* * * * *